(12) United States Patent
Toda

(10) Patent No.: US 7,889,538 B2
(45) Date of Patent: Feb. 15, 2011

(54) THREE-DIMENSIONAL MEMORY DEVICE

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 17 days.

(21) Appl. No.: 12/501,116

(22) Filed: Jul. 10, 2009

(65) Prior Publication Data

US 2010/0008126 A1    Jan. 14, 2010

(30) Foreign Application Priority Data

Jul. 14, 2008    (JP) .............................. 2008-182410

(51) Int. Cl.
  *G11C 11/36*    (2006.01)
(52) U.S. Cl. ........................ 365/148; 365/100; 365/130; 365/230.06; 365/230.03; 365/175
(58) Field of Classification Search ................. 365/148, 365/100, 130, 230.03, 230.06, 175
  See application file for complete search history.

(56) References Cited

U.S. PATENT DOCUMENTS

| | | | |
|---|---|---|---|
| 6,504,753 B1 * | 1/2003 | Scheuerlein et al. | ........ 365/175 |
| 6,545,898 B1 * | 4/2003 | Scheuerlein | ................. 365/94 |
| 6,618,295 B2 * | 9/2003 | Scheuerlein | ........... 365/189.09 |
| 6,917,539 B2 | 7/2005 | Rinerson et al. | |
| 7,061,037 B2 | 6/2006 | Ju et al. | |
| 7,570,511 B2 * | 8/2009 | Cho et al. | .................... 365/163 |
| 2003/0128581 A1 * | 7/2003 | Scheuerlein et al. | ... 365/185.03 |
| 2003/0214841 A9 * | 11/2003 | Scheuerlein et al. | ... 365/185.03 |
| 2004/0062094 A1 * | 4/2004 | Cleeves | ........................ 365/200 |
| 2005/0099856 A1 * | 5/2005 | Cleeves | ........................ 365/200 |
| 2008/0002456 A1 | 1/2008 | Toda et al. | |
| 2008/0025134 A1 * | 1/2008 | Scheuerlein et al. | ... 365/230.06 |
| 2008/0112209 A1 * | 5/2008 | Cho et al. | .................... 365/148 |
| 2010/0046273 A1 * | 2/2010 | Azuma et al. | ................ 365/148 |

OTHER PUBLICATIONS

U.S. Appl. No. 12/359,555, filed Jan. 26, 2009, Haruki Toda.

* cited by examiner

*Primary Examiner*—Hoai V Ho
*Assistant Examiner*—Jay Radke
(74) *Attorney, Agent, or Firm*—Oblon, Spivak, McClelland, Maier & Neustadt, L.L.P.

(57) ABSTRACT

A three-dimensional memory device includes: a plurality of mats laminated therein, each having memory cells arranged in a two-dimensional manner; and access signal lines and data lines to select memory cells in each mat being shared between respective adjacent mats. Laminated mats are divided into three or more groups. When selecting one of these groups, memory cells in some of the remaining groups are biased so that a leakage current flows therethrough, while memory cells in the rest of the remaining groups are biased so that a leakage current does not flow therethrough.

19 Claims, 26 Drawing Sheets ternary

| WL Group binary | Mat Number | mod 4 |
|---|---|---|
| 1 | 0,1,2,3,4,5,6,7,8,9,10,11,12,13,14,15,··· | 0,1,2,3 |
| 0 | 0,1,2,3,4,5,6,7,8,9,10,11,12,13,14,15,··· | 0,1,2,3 |

| WL Group ternary | Mat Number | mod 6 |
|---|---|---|
| 2 | 2,3,4,5,8,9,10,11,14,15,··· | 2,3,4,5 |
| 1 | 0,1,2,3,6,7,8,9,12,13,14,15,··· | 0,1,2,3 |
| 0 | 0,1,4,5,6,7,10,11,12,13,··· | 1,4,5,0 |

| WL Group quadruple | Mat Number | mod 8 |
|---|---|---|
| 3 | 4,5,6,7,12,13,14,15,··· | 4,5,6,7 |
| 2 | 2,3,4,5,10,11,12,13,··· | 2,3,4,5 |
| 1 | 0,1,2,3,8,9,10,11,··· | 0,1,2,3 |
| 0 | 0,1,6,7,8,9,14,15,··· | 6,7,0,1 |

| WL Group i-ary | Mat Number | m(mod 2i) |
|---|---|---|
| i−k<br>k=1∼i | m | −2k+1<br>−2k<br>−2k−1<br>−2k−2 |

FIG. 15

| WG/WGc | | MWL | PRDC | WL Impedance – Level | |
|---|---|---|---|---|---|
| WGc Selected | Selected WG="H" | Selected | Selected | L–Vss | 1 |
| | | | Non-Selected | H'–Vd* | 2 |
| | | Non-Selected | – | L–Vd* | 3 |
| | Selected Pair WG="L" | Selected | Selected | H–Vd* | 4 |
| | | | Non-Selected | H'–Vd* | 5 |
| | | Non-Selected | – | L–Vd* | 6 |
| WGc Non-Selected | | Selected | Selected | H–Vd* | 7 |
| | | | Non-Selected | H,H'–Vs* | 8 |
| | | Non-Selected | – | H–Vs* | 9 | i=3 (ternary)

A14~A10
(Total Mats=32)

| A14 | A13 | A12 | A11 | A10 | m |
|---|---|---|---|---|---|
| 0 | 0 | 0 | 0 | 0 | 0 |
| 0 | 0 | 0 | 0 | 1 | 1 |
| 0 | 0 | 0 | 1 | 0 | 2 |
| 0 | 0 | 0 | 1 | 1 | 3 |
| ...... | | | | | ... |
| 1 | 1 | 1 | 1 | 1 | 31 |

| WGc (ternary) | m | mod 6 |
|---|---|---|
| 2 | 2,3,4,5,8,9,10,11,14,15,··· | 2,3,4,5 |
| 1 | 0,1,2,3,6,7,8,9,12,13,14,15,··· | 0,1,2,3 |
| 0 | 0,1,4,5,6,7,10,11,12,13,··· | 1,4,5,0 | half adder

FIG. 26 i=4 (quadruple)

A14~A10
(Total Mats=32)

| A14 | A13 | A12 | A11 | A10 | m |
|---|---|---|---|---|---|
| 0 | 0 | 0 | 0 | 0 | 0 |
| 0 | 0 | 0 | 0 | 1 | 1 |
| 0 | 0 | 0 | 1 | 0 | 2 |
| 0 | 0 | 0 | 1 | 1 | 3 |
| ...... | | | | | ... |
| 1 | 1 | 1 | 1 | 1 | 31 |

| WGc (quadruple) | Mat Number | mod 8 |
|---|---|---|
| 3 | 4,5,6,7,12,13,14,15,··· | 4,5,6,7 |
| 2 | 2,3,4,5,10,11,12,13,··· | 2,3,4,5 |
| 1 | 0,1,2,3,8,9,10,11,··· | 0,1,2,3 |
| 0 | 0,1,6,7,8,9,14,15,··· | 6,7,0,1 |

THREE-DIMENSIONAL MEMORY DEVICE

CROSS REFERENCE TO RELATED APPLICATIONS

This application is based on and claims the benefit of priority from prior Japanese Patent Application No. 2008-182410, filed on Jul. 14, 2008, the entire contents of which are incorporated herein by reference.

BACKGROUND OF THE INVENTION

1. Field of the Invention

The present invention relates to a memory device with cell arrays arranged in a three-dimensional manner, and in particular, to a method of selecting cell array layers to reduce the effects of defective cells.

2. Description of the Related Art

Resistance RAM (ReRAM), which changes the resistance state of material with voltage, current, heat, etc., and utilizes the resistance state as data, has gained increasing attention as a likely candidate for replacing NAND-type flash memory (see, for example, Y. Hosoi et al, "High Speed Unipolar Switching Resistance RAM (RRAM) Technology" IEEE International Electron Devices Meeting 2006 Technical Digest p. 793-796). The resistance RAM seems to offer a high availability as large capacity file memory from the viewpoint of its suitability for refinement and lamination, while enabling configuration of cross-point cells.

However, in order to allow for lamination of a large number of cell arrays, the selection scheme is important for selecting a layer to which a selected memory cell belongs. This is because, in most cases, the cell arrays are configured as cross-point cell arrays and signal wirings (such as access signal lines or data lines) for selecting cells are shared between layers, which could result in the effects of leakage current in defective cells encountered across different layers. If the effects of leakage current are pervasive, this may result in malfunction or increased power consumption. Consequently, this may reduce the effects of larger capacity obtained by the multi-layer configuration.

In addition, in order to achieve a simpler structure in a connection portion between wirings extended from the laminated cell array layers and circuits on a base substrate, it is important to share a signal wiring between layers. However, it is necessary to optimize the limitation of the effects of defective cells in relation to the sharing of the signal wirings.

SUMMARY OF THE INVENTION

One aspect of the present invention provides a three-dimensional memory device comprising: a plurality of mats laminated therein, each having memory cells arranged in a two-dimensional manner; and access signal lines and data lines to select memory cells in each mat being shared between respective adjacent mats, laminated mats being divided into three or more groups, and, when selecting one of these groups, memory cells in some of the remaining groups being biased so that a leakage current flows therethrough, while memory cells in the rest of the remaining groups being biased so that a leakage current does not flow therethrough.

Another aspect of the present invention provides a three-dimensional memory device comprising:

a semiconductor substrate;

a three-dimensional cell array having a plurality of mats laminated on the semiconductor substrate, each having memory cells arranged in a two-dimensional manner, and access signal lines and data lines to select memory cells in each mat being shared between respective adjacent mats; and a control circuit formed on the semiconductor substrate below the three-dimensional cell array, the control circuit controlling read and write of the three-dimensional cell array, the control circuit having a group selection circuit, the group selection circuit, when mats in the three-dimensional cell array being divided into three or more groups, and when one of these groups being selected, being configured to select some of the remaining groups concurrently, and not to select the rest of the remaining groups.

Still another aspect of the present invention provides a three-dimensional memory device comprising:

a semiconductor substrate;

a mat including memory cells arranged in a two-dimensional manner on the semiconductor substrate, the memory cells positioned at cross-points of access signal lines and data lines, each of the memory cells having a variable resistance element and a diode connected in series, the variable resistance element being capable of setting a resistance value in a reversible manner by applying voltage;

a three-dimensional cell array including a plurality of the mats laminated therein, with the access signal lines or the data lines being shared between adjacent mats; and a control circuit formed on the semiconductor substrate below the three-dimensional cell array, the control circuit controlling read and write of the three-dimensional cell array, the control circuit having a group selection circuit, the group selection circuit, when mats in the three-dimensional cell array being divided into three or more groups, and when one of these groups being selected, being configured to select some of the remaining groups concurrently, and not to select the rest of the remaining groups, and when selecting one of the plurality of groups in the three-dimensional cell array, the group selection circuit being configured to set diodes between access signal lines and data lines to reverse-biased state in some of the remaining groups, and memory cells to inactive state without any leakage in the rest of the remaining groups.

BRIEF DESCRIPTION OF THE DRAWINGS

FIG. 15 illustrates the selected/non-selected word line groups as well as word line impedance states and levels;

FIG. 26 illustrates relations between address bits and mat numbers as well as between selection signals WGc and the mat numbers for quadruple grouping;

DETAILED DESCRIPTION OF THE EMBODIMENTS

Embodiments of the present invention will be described below.

[ReRAM Configuration Overview]

Figure 1:
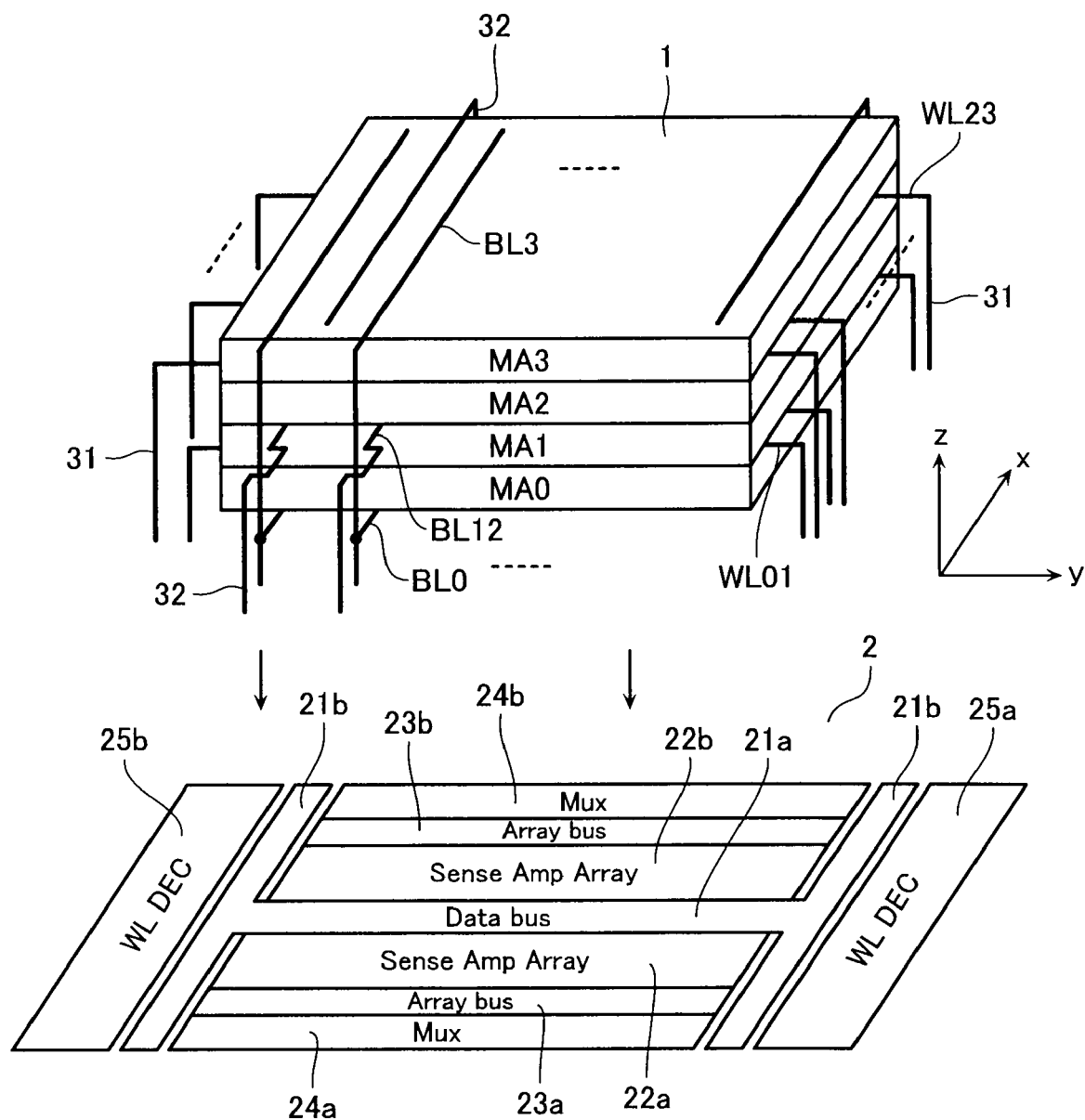
FIG. 1 illustrates a configuration of a 3D-ReRAM according to an embodiment.

FIG. 1 illustrates a general configuration of a 3D cell array block 1 and a base control circuit 2 that are included in a ReRAM with a three-dimensional (3D) cell array structure according to an embodiment. In this case, for simplicity, the cell array block 1 is illustrated with four layers of cell arrays MA0 to MA3 laminated therein.

It is assumed that a word line WL and a bit line BL are provided in a manner that they are shared between adjacent cell arrays. The word lines WL of each cell array layer are alternately connected to the base control circuit 2 via vertical wirings 31 at the opposite ends in the word line direction (y direction). The bit lines BL alternately extend out from the opposite ends in the bit-line direction (x direction). In addition, the bit lines BL are commonly connected between layers, at even- and odd-numbered layers (counted from the bottom of the 3D cell array layers), respectively, and then connected to the base control circuit 2. That is, it is assumed that all of the four sides of the cell array block 1 are used as regions for arranging vertical wirings 31 and 32 for the word lines WL and the bit lines BL. On the other hand, there is an alternate method where the bit lines are not commonly connected between layers at even- and odd-numbered layers, and, in the following embodiment, such a configuration without common connection of the bit lines will be described.

An example of major circuit arrangement of the control circuit 2 is illustrated in FIG. 1. The bit lines, which are drawn to the substrate from the opposite ends of the cell arrays in the bit-line direction through the vertical wirings 32, are selected by multiplexers (MUX) 24a, 24b to obtain signals on array buses 23a, 23b. These signals on the respective buses are input to sense amplifier circuits 22a, 22b. Data is communicated between the sense amplifier circuits 22a, 22b and the external via data buses 21a, 21b.

In the word line direction, the word lines, which are drawn to the substrate from the opposite ends of the cell arrays through the vertical wirings 31, enter into word-line decoders/multiplexers 25a, 25b. In this case, as a bus region setting in view of data communication with the external, the word-line decoders/multiplexers 25a, 25b and the cell array block 1 are spaced apart from each other, and some of the data buses 21b are positioned in the space.

The region of the data bus 21a that is located immediately below the cell array block 1 is divided into two data buses 21b that are orthogonal to its wiring region. The buses 21b are located along both sides of the word line end in the cell array block 1. Then, the buses 21b exit outside from the region immediately below the cell array block 1.

Figure 2:
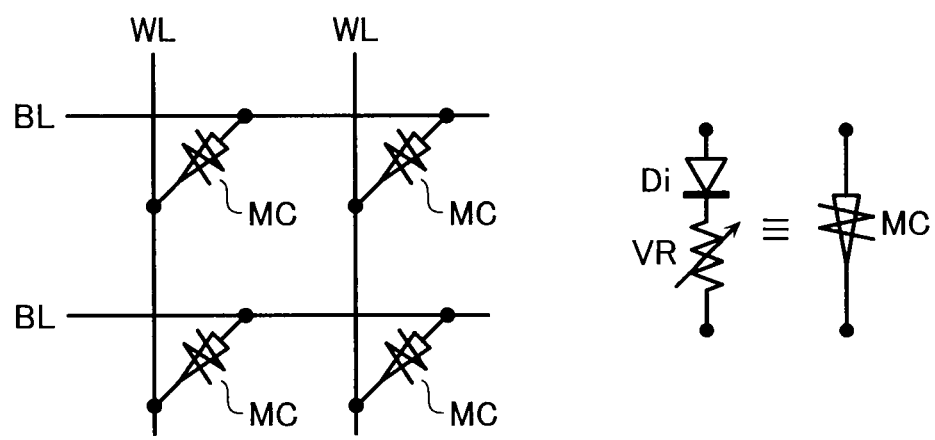
FIG. 2 illustrates an equivalent circuit of a unit cell array in the same ReRAM.
Figure 3:
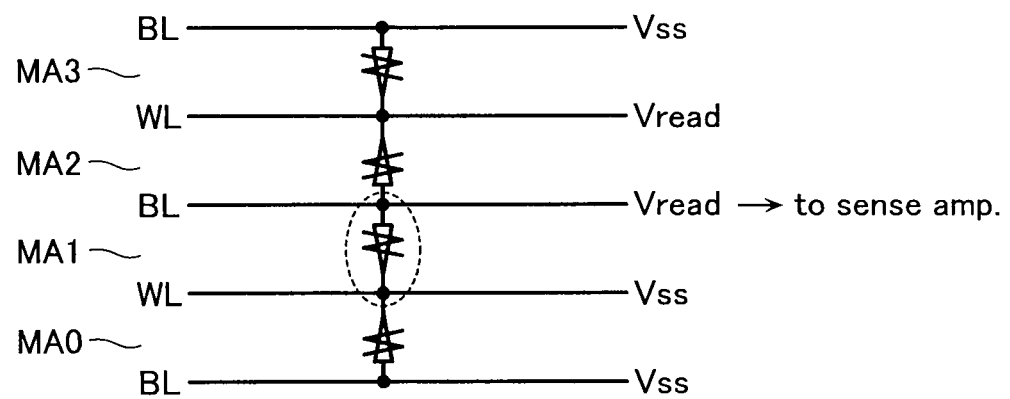
FIG. 3 illustrates the selection states of laminated cell pillars in the same ReRAM.

FIG. 2 illustrates an equivalent circuit of a cell array in each layer. A memory cell MC, which has a variable resistance element VR and a diode Di connected in series, is positioned at each cross-point of a word line WL and a bit line BL. FIG. 3 illustrates a case where the diode polarity of a memory cell is reversed between adjacent ones of the cell arrays MA0-MA3 in different layers.

For example, in reading data, the selected word line is set to Vss, Vread is provided to the selected bit line, non-selected word lines are set to Vread, and non-selected bit lines are set to Vss, by which data in a selected cell in a selected cell array may be read by a sense amplifier.

To set the selected cell from a high-resistance state (reset state) to a low-resistance state (set state), the selected word line is set to Vss, the selected bit line is set to Vp, and a voltage Vp-Vss necessary for writing to the selected cell is then provided thereto with a certain pulse width. This enables the variable resistance element in the selected cell to change to a low-resistance state through voltage processes (setting operation).

To set the selected cell from a low-resistance state to a high-resistance state, a resetting voltage is provided to the selected cell with a voltage and pulse width different from (or same as) those used in setting operation, utilizing thermal processes with Joule heat produced by corresponding elements (reset operation).

As used herein, it should be noted that the roles of word lines WL and bit lines BL are for illustrative purposes only, and which lines should be referred to as "word lines" is determined depending upon the system circumstances.

According to this embodiment, the ReRAM with 3D cell arrays as mentioned above reduces the effects of leakage current in defective cells by dividing the 3D cell arrays into three or more groups and selectively inactivating some of these groups.

[Technical Elements Overview of this Embodiment]

Technical elements of this embodiment are summarized as follows:

(1) In a 3D memory device having a plurality of cell arrays laminated therein, each having memory cells arranged in a two-dimensional matrix form (which may be referred to hereinafter as "mats"), access signal lines/data lines for selecting memory cells that are shared between different layers are divided into three or more groups, and, in some of these groups, most of these access signal lines/data lines should be set within a range of potential differences smaller than that for generating a cell current in the memory cells between the access signal lines and the data lines.

(2) In the same 3D memory device, the access signal lines/data lines are divided into three or more groups, and such a potential difference is provided only in some of these groups that is not less than that for generating a cell current in the memory cells between the access signal lines and the data lines.

(3) Each of the memory cells is configured as a serial connection of a diode and a variable resistance element that changes a resistance value by applying voltage or current greater than a certain level, and each of the unit cell arrays is configured as a cross-point cell array, wherein a memory cell is positioned between an access signal line (word line WL) and a data line (bit line BL). The ReRAM with 3D cell arrays are configured in such a way that a plurality of cell arrays are laminated with the access signal lines and the data lines shared between the cell arrays and the cell condition is determined by monitoring the cell current in the data lines.

In the ReRAM so configured, the access signal lines are divided into three or more groups in relation to the layer selection and shared between layers for each group. The potentials of the access signal lines and data lines, other than those in the cell array including the selected memory cell, are set in such a way that the diodes in the memory cells are reverse-biased.

(4) In a 3D memory device having a plurality of mats laminated therein, each having memory cells arranged in a two-dimensional matrix form, access signal lines/data lines for selecting memory cells are divided into three or more groups. In addition, in order to select a group provided with the same potential to non-selected access signal lines, a circuit for generating a signal to select a group providing the same potential from an address bit that identifies a mat to which the selected memory cell belong is configured with an adder for address bits.

(5) In a 3D memory device with a double word line scheme, potentials of access signal lines are set by selecting a main word line and selectively supplying a selection signal to a plurality of partial-word-line driver circuits. The partial-word-line driver circuits are selected by the main word line. The 3D memory device comprises: a partial-word-line driver circuit for each group of the access signal lines; and a circuit switching the current path in the access signal lines based on a combination of active states of the signal to select a group.

(6) In a 3D memory device with a double word line scheme, the potentials of access signal lines are set by selecting a main word line and selectively supplying a selection signal to a plurality of partial-word-line driver circuits. The partial-word-line driver circuits are selected by the main word line. The 3D memory device comprises a partial-word-line driver circuit for each group of the access signal lines. In addition, the access signal lines in each of the grouped layers are commonly connected for each grouped layers and then connected to the outputs of the partial-word-line driver circuits on the substrate.

[Leakage Current Effect]

Figure 4:
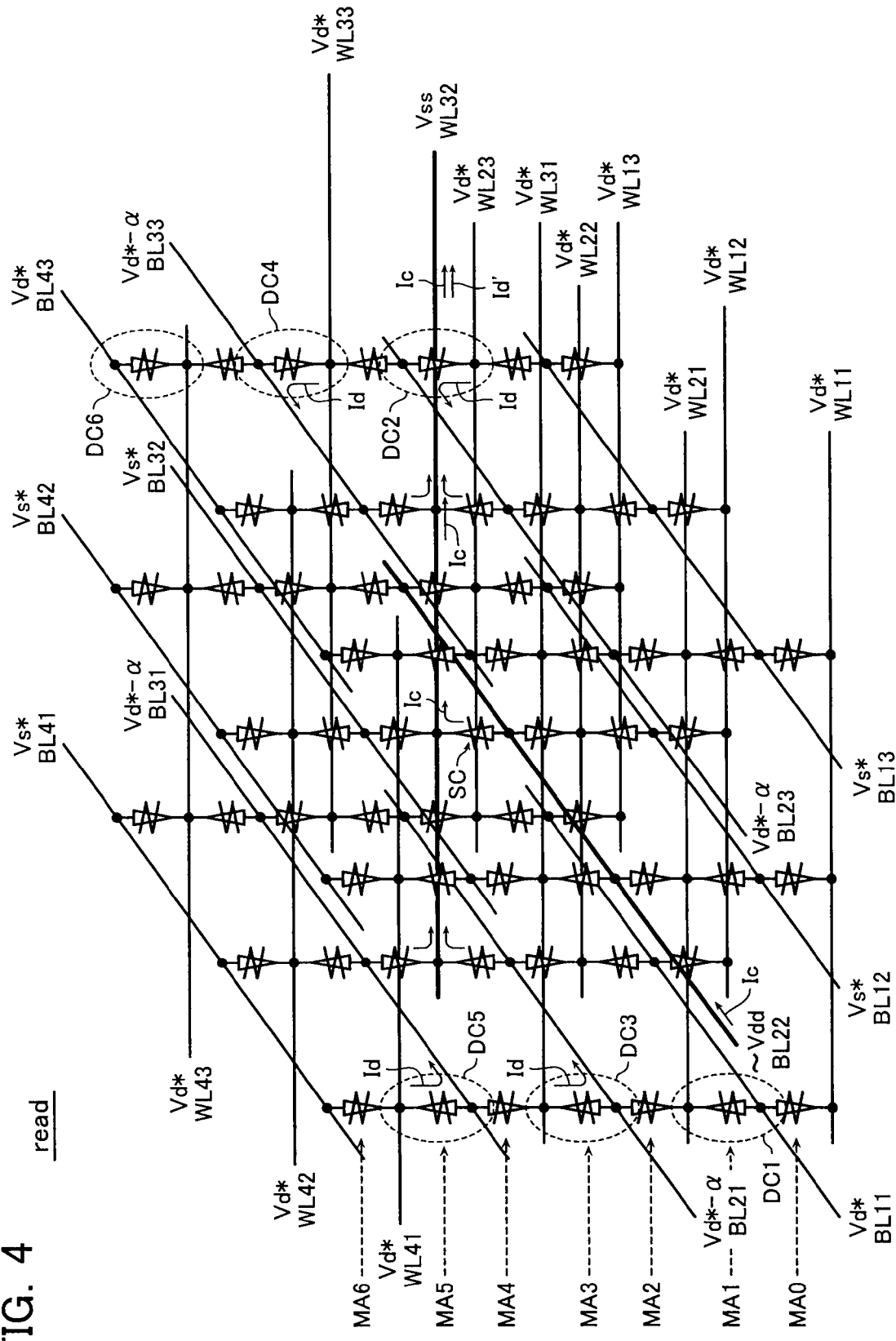
FIG. 4 illustrates the effects of cross fail on each layer of the same ReRAM.

Prior to describing a specific embodiment, referring first to FIG. 4, consider the effects of leakage current on a 3D-ReRAM with a scheme wherein the bit lines BL and the word lines WL are each shared between adjacent cell arrays. Specifically, consider how defective cells in distant mats will affect the selected cell.

FIG. 4 illustrates the leakage effects of defective cells DC1 to DC6 within seven layers of cell arrays MA0-MA6 when a cell SC is selected by a word line WL32 and a bit line BL22 indicated by the thick line.

A cell is selected by providing certain voltages to the word line WL and the bit line BL that intersects at a cross point where the selected cell is located. Specifically, the word line WL is provided with the ground voltage Vss, while the bit line BL is provided with a voltage corresponding to the operation modes, thereby controlling the current flowing through the bit line BL. As FIG. 4 illustrates a case of read operation, the selected bit line BL22 is provided with a read voltage lower than the power-supply voltage Vdd.

Non-selected word lines WL are applied with a high voltage, e.g., Vd* (which is lower than the maximum voltage Vdd applied to the bit lines BL, by a voltage Vf substantially equal to forward voltage drop of the diode). On the other hand, non-selected bit lines BL are provided with a voltage Vs* (which is higher than the minimum voltage Vss applied to the bit lines BL, by the voltage Vf) to prevent any forward current from flowing into the diodes.

Note that non-selected bit lines may be set in a floating state, as long as they have substantially a potential of Vs* during operation. It is assumed that the bit lines BL are detected in advance whether they include a defective memory cell deemed as defective due to poor reverse breakdown voltage characteristics of the diode and large leakage current. Such bit lines are set in a floating state.

FIG. 4 illustrates a case where a cell SC is selected and read at the middle layer MA3 of seven layers of mats, and the second to sixth layers MA1-MA6 involve defective cells DC1 (MA1), DC2 (MA2), DC3 (MA3), DC4 (MA4), DC5 (MA5), DC6 (MA6) with large reverse-bias leakage, respectively.

Provided that the cell SC selected at the middle layer mat MA3 does not share the bit line and the word line with the defective cells, the selected word line WL32 is applied with Vss, whereas the selected bit line BL22 is applied with a significantly lower potential level than Vdd.

Those bit lines (defective bit lines) connected to the defective cells are set at a floating state. As can be seen from FIG. 4, the leakage current Id flowing through the defective cells DC2, DC4, DC3, DC5 flows through the bit lines BL21, BL23, BL31, BL33, which have in turn respective paths flowing into the selected word line. Accordingly, the bit lines BL21, BL23, BL31, and BL33 become Vd*−α, which is slightly lower than Vd*.

The defective bit line BL43 on the top layer mat becomes Vd* because it does not have current path into which the leakage current of the defective cell DC6 flows. Similarly, the defective bit line BL11 on the second layer mat also becomes Vd* because it does not have current path into which the leakage current of the defective cell DC1 flows.

The paths from the selected bit line BL22 to non-selected word lines become reverse-biased paths from a significantly lower level than Vdd to Vd*, and the cell diodes remain at off state. The selected cell will not experience any voltage or current disturbance.

As can be seen from FIG. 4, in addition to the cell current Ic flowing into the selected cell, the combined leakage current Id' flows into the selected word line WL32 from cross fails above and below the selected word line WL32 by two mats. Thus, providing such a circuit or element at this position that detects a current value of the selected cell may lead to malfunction. Although, in read operation, a minute cell current Ic flows into the selected bit line BL22 and the amount of this current is sensed, the inflowing current from the cross fails will not disturb the reading operation and no problem arises.

The leakage from the defective bit lines is caused by a voltage difference between Vd* and Vss, and the leakage current flowing into the selected word line increases in proportional to the number of defects in two mats above the selected word line, and two mats below the selected word line. Therefore, it is necessary to enhance, in particular, the capability of driving the selected word line to Vss for preventing malfunction.

Figure 5:
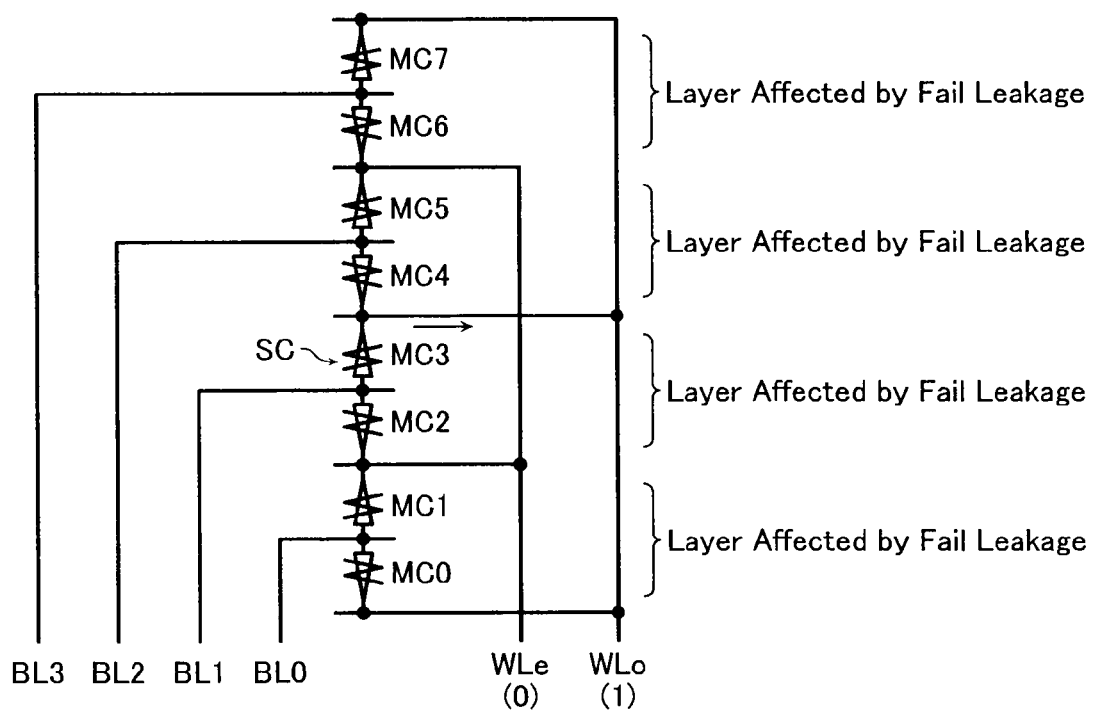
FIG. 5 illustrates how a cross fail affects the cell pillars.

FIG. 5 illustrates, as an example, how the wirings are drawn when word lines and bit lines are shared between layers in a cell array with multiple layered mats. In this case, pillars of eight layers of cells MC0-MC7 are depicted. Since it is desired to control the bit lines separately for each layer, the bit lines BL0-BL3 in respective layers are separately wired to the base control circuit. On the other hand, it is also desired to reduce the number of word line groups by sharing the word lines as much as possible, in order to reduce the area of the contact region with the base circuit. Provided that the minimum number of groups that can avoid multiple access to the cell from occurring is 2, and that these groups are named "even" and "odd" and represented by WLe (or WL(0)) and WLo (or WL(1)), the resulting connection is as illustrated in FIG. 5.

For such grouping of the word lines, for example, if a cell MC3 is a selected cell SC, then the leakage current from the cross fails in respective two layers (MC4, MC5 and MC2, MC3) above and below the selected layer, will concentrate on the selected word line WLo. Thus, it is expected that the cross-fail leakage in all layers will concentrate on a driver for driving the group to which the selected word line WLo belong. This would impose a limit for the multi-layer configuration, a feature of the 3D cell arrays.

Specifically, consider how such leakage current will concentrate in view of the following several groupings.

[Leakage Effects for Binary Grouping]

Figure 6:
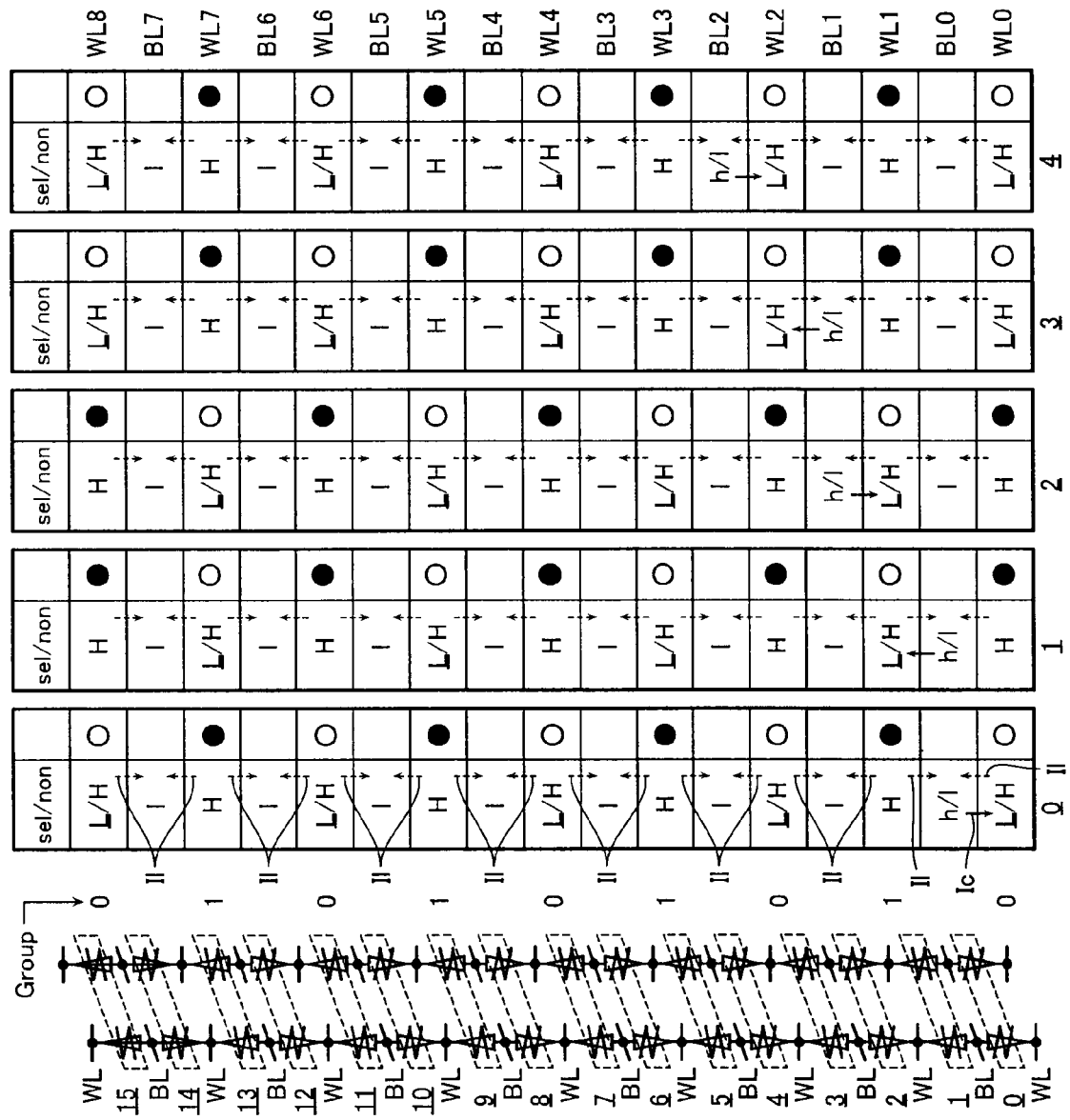
FIG. 6 illustrates the leakage current distribution for binary grouping of 16-layer mat configuration.

FIG. 6 illustrates a case of division into 2 groups as described above (binary case), with the configuration including 16 layers of mats. In the left side of FIG. 6, sixteen layers of mats are illustrated as two pillars of memory cells. The memory cells in the two pillars illustrated in FIG. 6 is supposed to belong to different word lines and bit lines. Underlined numbers in FIG. 6 represent mat numbers counted from bottom. In binary case, either a group number of "0" or "1" is alternately assigned to each word line.

The table illustrated in the right side of FIG. 6 illustrates the respective levels of the word lines and the bit lines, as well as the current flowing through the cells provided therebetween and the flowing direction thereof, when cells are selected from among 16 layers of mats. Five columns (sections) in FIG. 6 with numbers 0-4 each represents a case where either one of mat numbers 0-4 is selected, respectively. Each section of the table indicates the level of a group of laminated word lines and a group of bit lines when a mat is selected. That is, the lowest section describes a group of word lines WL0 corresponding to the mat number 0, the next lowest section describes a group of bit lines BL0 corresponding to the same mat number 0. Likewise, lines WL1, BL1, WL2, BL2, . . . , WL7, BL7, and WL8 are laminated.

Further, each section of the table indicates in parallel the respective levels of a selected cell and a non-selected cell (sel/non) in the corresponding mat. That is, the selected/non-selected level relation for the word lines is indicated by L/H in upper cases (capital letters), while the selected/non-selected level relation for the bit lines is indicated by h/l in lower cases (small letters).

Upon selection of a cell in the mat 0, as illustrated in the leftmost section of the table, the selected bit line becomes h (i.e., to Vdd) and non-selected bit lines become l (=Vs*) in the group of bit lines BL0, while the selected word lines remain at L (=Vss) and non-selected word lines remain at H (=Vd*) in the group of word lines WL0. All of the bit lines on the remaining mats are at non-selected level l. In the groups of word lines WL2, WL4, WL6, WL8 corresponding to other mats 3, 7, 11, 15 assigned with the word line group number "0" (indicated by the white circles), selected/non-selected=L/H are set as in the mat including the selected cell. In the mats with the group number "1" (indicated by the black circles) the word lines are at non-selected state H.

Accordingly, when a cell is selected at mat 0, the selected cell current Ic as indicated by the full-line arrow flows from the selected bit line to the selected word line. As indicated by the broken-line arrow, there exist leakage currents Il from the word lines to the bit lines due to the reverse breakdown voltage characteristics of the diodes or cross fails, and, in binary case, such leakage current Il may flow through all of the mats.

Other cases are illustrated in a similar manner where cells on the mats 1, 2, 3, and 4 are selected.

As can be seen from the tables, since all cells other than the selected cell are reverse-biased in binary case, the leakage current from all mats leaks from the word line groups. If a large number of mats present (i.e., memory cells are laminated into many layers), it is necessary to consider the effects of all cells and a huge amount of current must be considered.

[Leakage Effects for Ternary Grouping]

Figure 7:
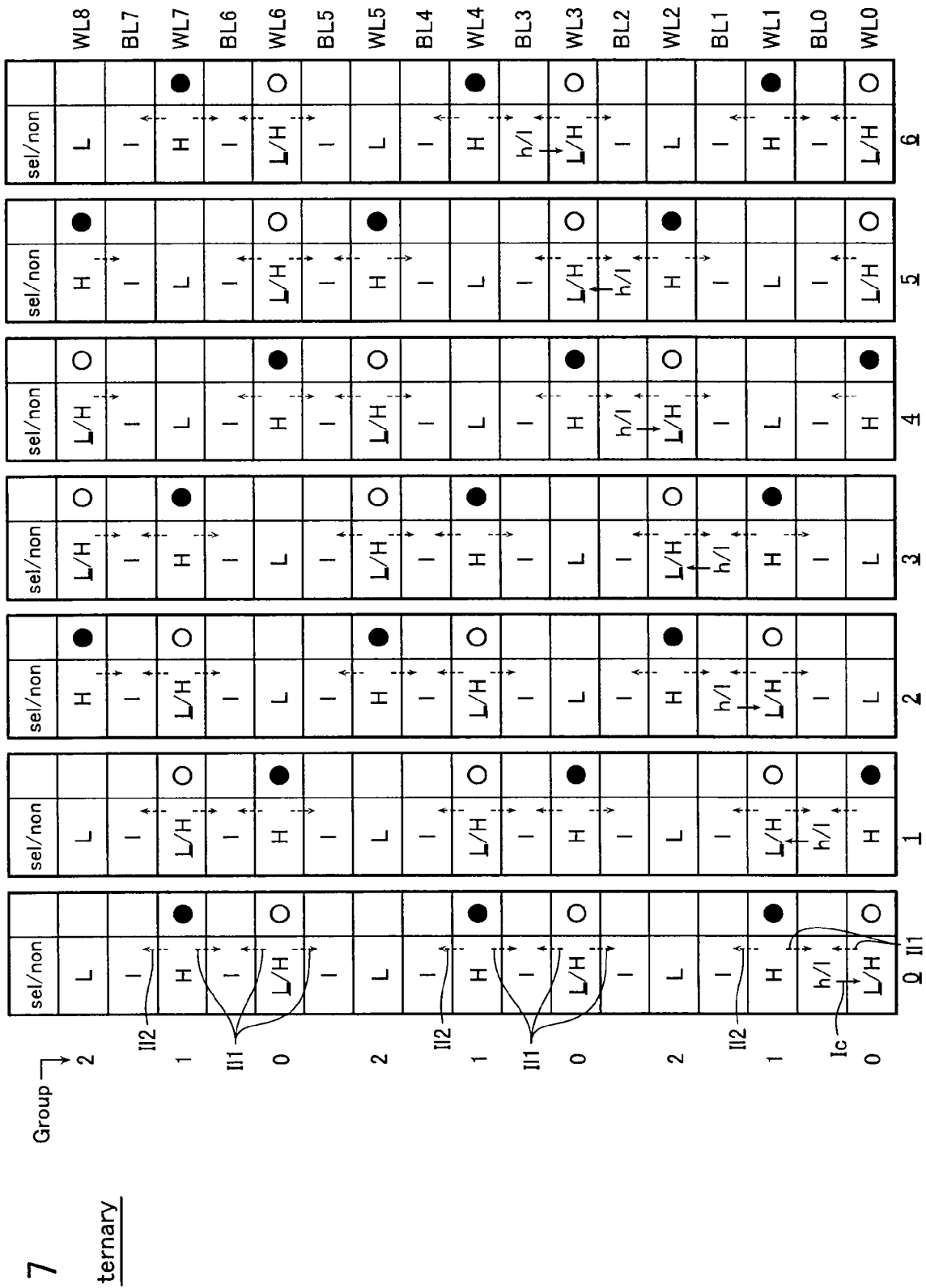
FIG. 7 illustrates the leakage current distribution in the case of ternary grouping of the same configuration.

FIG. 7 illustrates a case of division into 3 groups (ternary case), with the same configuration as described above including 16 layers of mats. That is, groups of word lines WL0, WL3, WL6 is set to group 0; WL1, WL4, WL7 to group 1; and WL2, WL5, WL8 to group 2.

The table illustrates the respective levels of the word lines and the bit lines, as well as the types of current flowing via the corresponding cell and the flowing direction thereof, when cells on mats 0, 1, 2, 3, 4, 5, 6 are selected in a similar relation to that illustrated in FIG. 6.

As indicated by the white circles, when the word line on the mat 0 is selected, selected/non-selected=L/H is set for the groups of word lines WL3, WL6 at the other mats 6 and 12 in group 0, as in the mat 0. In the mats 2, 8, 14 in group 1 as indicated by the black circles, the word lines are at non-selected state H.

The unmarked groups of word lines WL2, WL5, WL8 belong to word line group 2 that is independent of mat selection and may remain at L level.

When the mat 0 is selected, the selected cell current Ic flows from the selected bit line to the selected word line. At this moment, the leakage current Il1 indicated by the broken line flows into the groups of bit lines BL0, BL3, BL6 from both word lines above and below these bit lines, whereas it flows into the groups of bit lines BL2, BL5 only from the word lines above these bit lines. The leakage current Il1 represents a leakage current due to the reverse breakdown voltage characteristics of the diodes or cross fails. The leakage current Il2 indicated by the broken line flows from the word lines in group 1 (the groups of word lines WL1, WL4, WL7) to the bit lines above these word lines. The leakage current Il2 represents a leakage current having no impact on the selected word line group. The word lines in group 2 (groups of word lines WL2, WL5, WL8) are independent of mat selection and remain at "L" level, i.e., the cell diodes are maintained at inactive state with substantially zero bias so that the leakage current is reduced.

Other cases are illustrated in a similar manner where cells on the mats 1, 2, 3, 4, 5, 6 are selected.

As can be seen from the tables, in ternary case, two-thirds of all cells other than the selected cell have reverse breakdown voltage characteristics, and the effects of reverse breakdown voltage leakage are reduced to two-thirds. It can be seen that the effects of cross fail appear at one half of all cells and the leakage current leaks from the word lines. Therefore, this may significantly reduce the effects of leakage current on the selected word line group, as compared with the binary case.

[Leakage Effects for Quadruple Grouping]

Figure 8:
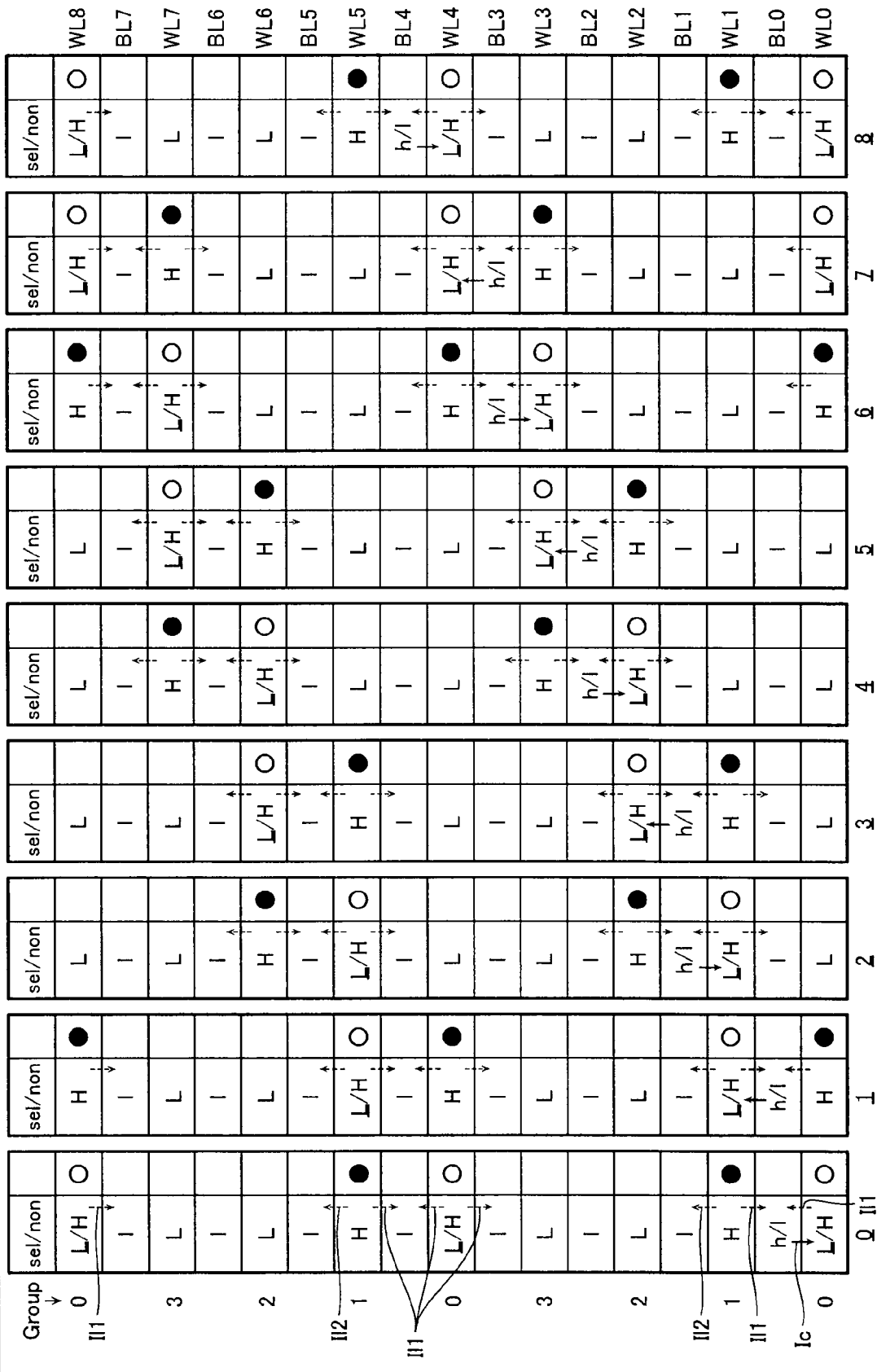
FIG. 8 illustrates the leakage current distribution for quadruple grouping of the same configuration.

FIG. 8 illustrates a case of division into 4 groups (quadruple case), with the same configuration including 16 layers of mats. That is, groups of word lines WL0, WL4, WL8 is set to group 0; groups of word lines WL1, WL5 to group 1; groups of word lines WL2, WL6 to group 2; and groups of word lines WL3, WL7 to group 3.

The table illustrates the respective levels of the word lines and the bit lines, as well as the types of current flowing via the corresponding cell and the flowing direction thereof, when cells on mats 0 to 8 are selected in a similar relation to that illustrated in FIG. 6.

As indicated by the white circles, when the word line on the mat 0 is selected, selected/non-selected=L/H is set for the groups of word lines WL4, WL8 at the other mats 7 and 15 in group 0, as in the mat 0. In the mats 2 and 10 in group 1 as indicated by the black circles, the word lines are at non-selected state H.

The unmarked groups of word lines WL2, WL3, WL6, WL7 belong to word line groups 2 and 3 that are independent of mat selection and may remain at L level.

When the mat 0 is selected, the selected cell current Ic flows from the selected bit line to the selected word line. At this moment, the leakage current Il1 indicated by the broken line flows into the groups of bit lines BL0, BL4 from both word lines above and below these bit lines, whereas it flows into the groups of bit lines BL3, BL7 only from the word lines above these bit lines. The leakage current Il1 represents a leakage current due to the reverse breakdown voltage characteristics of the diodes or cross fails. The leakage current Il2 indicated by the broken line flows from the groups of word lines WL1, WL5 to the bit lines above these word lines. The leakage current Il2 represents a leakage current having no impact on the selected word line group.

Other cases are illustrated in a similar manner where cells on the mats 1 to 8 are selected.

As can be seen from the table, in quadruple case, one-half of all cells other than the selected cell have reverse breakdown voltage characteristics, and the effects of reverse breakdown voltage leakage are reduced to one-half. The effects of cross fail involve the leakage current Il2 part, which would affect three-eights of all cells. Therefore, this may further reduce the effects of leakage current on the selected word line group, as compared with the ternary case.

[Group Selection Logic]

As described above, it can be seen that the effects of leakage current on the selected word line group may be reduced as the number of groups of word lines to be selected increases in the order: binary, ternary, and quadruple. In this case, since the word lines are shared between the mats, the selection logic among groups requires certain efforts. The word line selection logic will now be described below.

Figure 9:
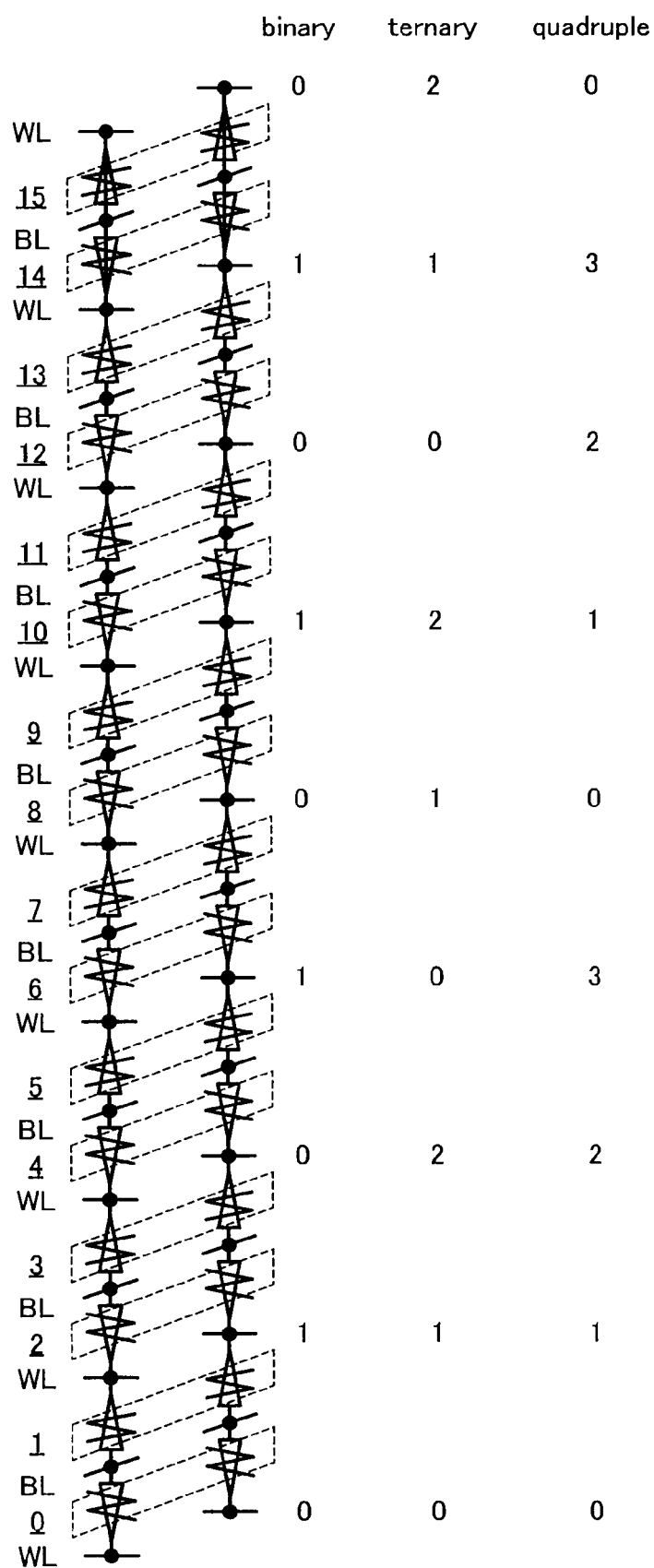
FIG. 9 generally illustrates cell pillars together with three types of word line groups in the case of 16-layer mats.

FIG. 9 generally illustrates the cell pillars in the case of 16 layers of mats together with three types of word line groups.

Figure 10:
FIG. 10 generally illustrates word line groups together with mat numbers that belong to a respective group selection for each group.

FIG. 10 generally illustrates, group by group, mat numbers that belong to a selected group, regarding each word-line grouping illustrated in FIG. 9. As mentioned earlier, since the word lines are shared between adjacent mats, it is necessary to activate all groups (i.e., all mats) in binary case, whichever group of cells are selected. In this case, the mat numbers can be grouped as congruent numbers of (0, 1, 2, 3) modulo 4, which is illustrated in the section entitled "mod 4".

In ternary case, the word line groups are 0, 1, and 2. Also, the mat numbers that belong to these word line group can be classified by their residues mod 6. Since the residue mod 6 of the mat number corresponding to a selected cell belongs to any one of two word line groups, one of the word line groups does not need to be activated.

In quadruple case, the word line groups are 0, 1, 2, and 3. Also, the mat numbers that belong to these group can be classified by their residues mod 8. Since the residue mod 8 of the mat number corresponding to a selected cell belongs to any one of two word line groups, two of the word line groups do not need to be activated.

To summarize the above, as illustrated in the bottom section of FIG. 10, the way of classifying the groups of word lines can be "i-ary" and the groups of word lines can be represented as i–k (k=1 to i), i.e., 0, 1, 2, . . . , i–2, i–1. If the mat number to which a selected cell belongs is m, then the number of an activated group of word lines is i–k which is calculated from k, wherein the residues of m mod 2i are –2k–2, –2k–1, –2k, –2k+1.

[Specific Leakage Effect]

While the description has been made on the classification of the groups of word lines and mat selection rules, a particular method will now be described below when these classification and rules are actually applied to the 3D cell arrays. At first, consider the specific leakage effects on the cell arrays in the case of dividing the word lines into three or more groups.

Figure 11:
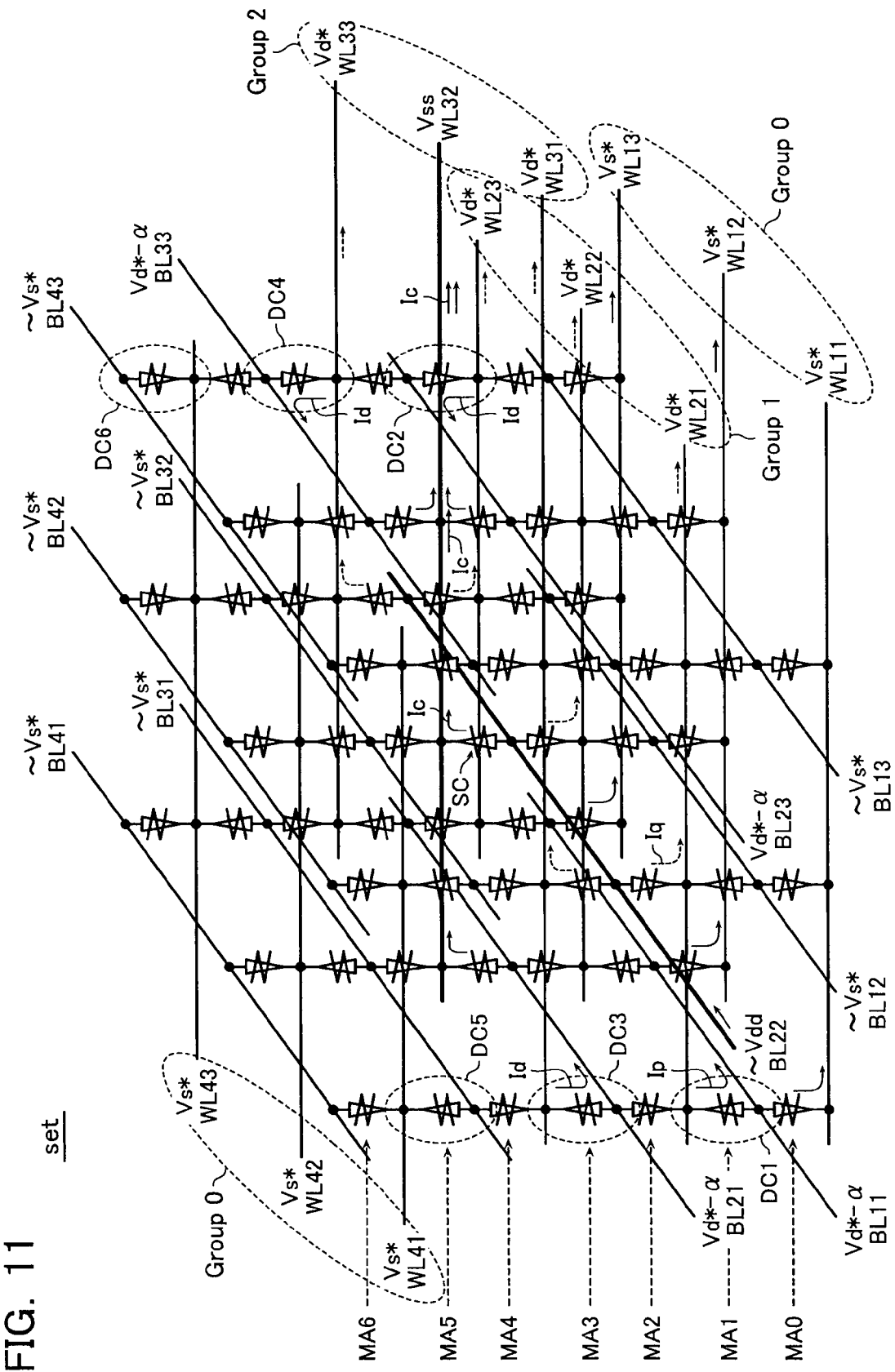
FIG. 11 illustrates the effects of leakage current between layers when the word lines are grouped into three or more groups.

As in the case of FIG. 4, FIG. 11 illustrates current flows when the cell SC on the mat just in the middle is accessed, regarding the mat configuration of seven layers of cell arrays MA0 to MA6, wherein the groups of word lines are divided into not less than 3 groups (specifically, in ternary case). A selected cell SC is selected by the word line WL32 indicated by the thick line as well as the bit line BL22, also indicated by the thick line. This example describes a write operation to the set state (setting operation) where Vdd is substantially applied to the selected bit line BL22 and the selected word line WL32 is driven to Vss.

Non-selected word lines (WL31, WL33) other than the selected word line WL32 in word line group 2 that are located on the mat to which the selected cell SC belong are set to Vd* (which is a potential lower than Vdd by on the order of a diode's Vf). The word lines in word line group 0 (WL11 to WL13, WL41 to WL43) are all set to Vs* (which is a potential higher than Vss by on the order of a diode's Vf), while the word lines WL21 to WL23 in word line group 1 are all set to Vd*.

All of the non-selected bit lines become Vs* in a floating state.

As in the case of FIG. 4, the defective cells involve cell DC1 in the cell array MA1, cell DC2 in the cell array MA2, cell DC3 in the cell array MA3, cell DC4 in the cell array MA4, cell DC5 in the cell array MA5, and cell DC6 in the cell array MA6. Among these, the defective cells with large impact on the selected cell are DC2, DC3, and DC4.

Since the bit lines (defective bit lines) to which the defective cells belong are always in a floating state, and the other non-selected bit lines are set to Vs* and only set at a floating state during short access periods, the levels of the defective bit lines become Vd*–α during access due to the leakage from the word line level Vd* via the defective cells.

The leakage current in this access state is under such circumstances as illustrated in FIG. 11. In addition to the original cell current Ic, the leakage current of the defective cells on the mat to which the selected cell SC belong as well as on the respective mats above and below the mat flows into the selected word line WL32 set to Vss. That is, the leakage current Id of the defective cells DC2, DC3, DC4 passes through the adjacent bit lines and flows into the selected word line WL32. Then, the leakage current Id is added to the cell current Ic.

For example, the leakage current Ip of the defective cell DC1 on the other mats is dispersed into the respective word lines WL11, WL12, WL13 that are set to Vs* as the non-selected word lines. In addition, the selected bit line BL22 is set to a potential of on the order of Vdd in a write operation to the set state. The selected bit line BL22 has a potential that is higher than the level Vd* of non-selected word lines in the selected word line group by on the order of a diode's forward bias voltage Vf. As such, a little on-current may possibly flow into a cell that is connected to the selected bit line BL22. This on-current leakage Iq is dispersed into the individual non-selected word lines.

However, the above-mentioned leakage current Iq from the above-mentioned selected bit line occurs only when performing a write operation to the set state. At this moment, the corresponding cells are at a high-resistance state, and the total current is small enough in order of magnitude as compared with the write operation to the reset state. Accordingly, the level of the selected bit line should not necessarily be changed, and the effects on the write operation to the set state are negligible.

As can be seen from the above, when driving the selected word line to Vss, it is necessary to provide sufficiently low impedance and enable it to act as a current sink sufficiently, because the leakage of the defective cells in the selected mat and the respective layers above and below the mat, is added to the drive current. On the other hand, when driving non-selected word lines to the set potential Vs* or Vd*, it is rather preferable to provide higher impedance for mitigating any weak forward current that should be dispersed into the non-selected word lines.

[WL and BL Selection Circuits]

Figure 12:
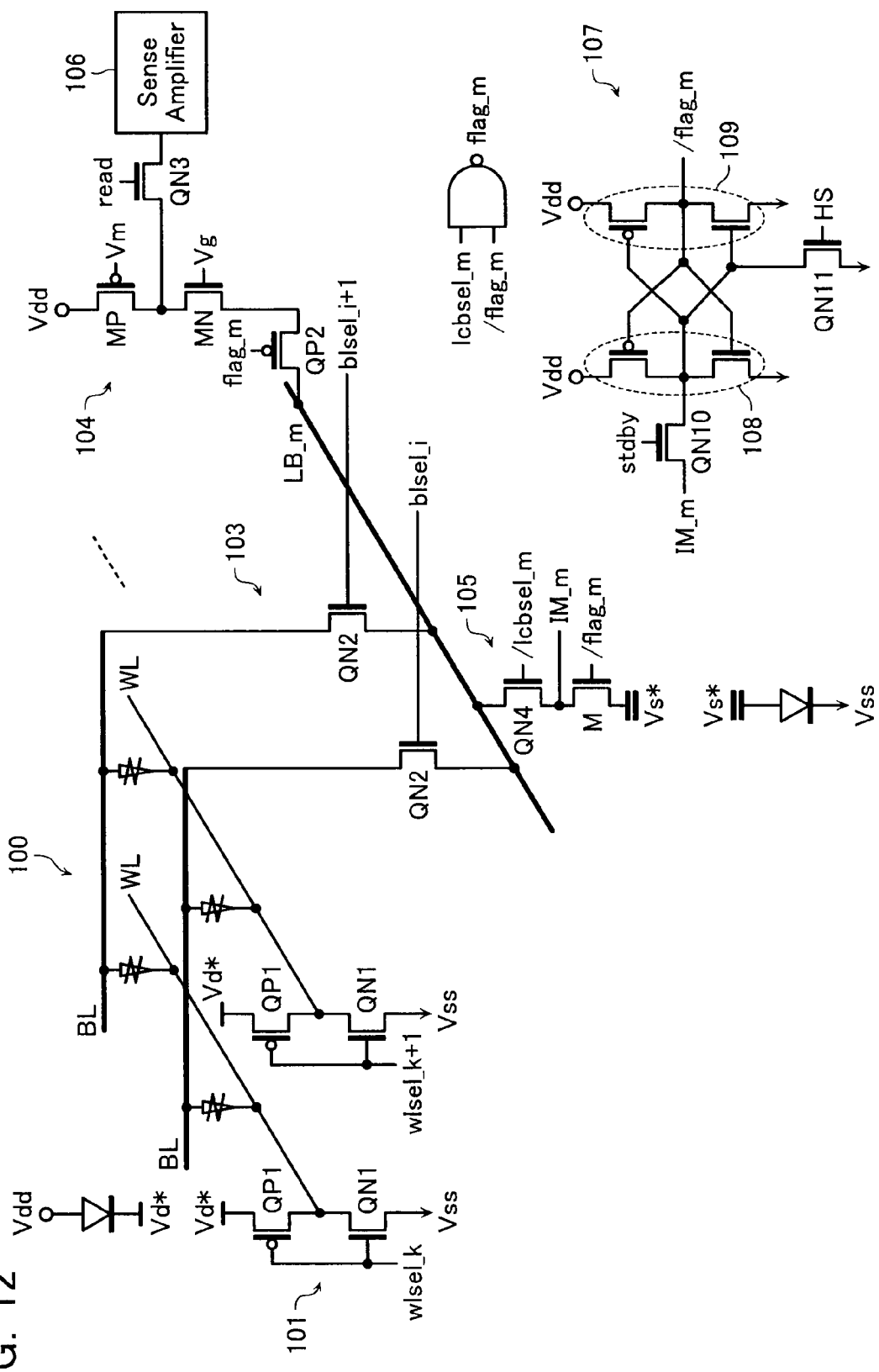
FIG. 12 illustrates a configuration of bit line/word line selection circuits.

FIG. 12 illustrates the detailed configuration of the word-line and bit-line selection circuit parts. In this 3D cell array, the groups of bit lines sharing a sense amplifier (SA) 106 is taken as one cell array unit (hereinafter, a "standby unit") 100. One of these groups of bit lines is selected by a bit-line selection circuit 103 and connected to a local bus LB_m. For clarity, only an NMOS transistor QN2 that is a selection transistor is illustrated here as the bit-line selection circuit 103.

A word line driver 101 is a CMOS driver that includes an NMOS transistor QN1 for setting the selected word line to Vss and a PMOS transistor QP1 for providing Vd* to non-selected word lines. These components are adapted to maintain sufficient levels against cross fails, both in selected/non-selected states, providing as small output impedance as possible.

A state-transition stabilizing circuit 104 is apart of an NMOS transistor MN and a PMOS transistor MP that is connected to the selected bit line via the local bus LB_m.

A bit-line resetting circuit 105 is a circuit for setting non-selected bit lines to Vs*, which is configured with an NMOS transistor QN4. An NMOS transistor M for detecting defective cells is inserted at the source side of the NMOS transistor QN4.

For setting the potentials of the word lines and the bit lines, a potential of Vs* is generated that is higher than the ground level Vss by a diode forward drop voltage Vf, and a potential of Vd* is generated that is lower than the power supply voltage Vdd higher than the set voltage by Vf.

The word line driver 101 is controlled by a control signal wlsel_x (x=k, k+1, ... ) to set one word line selected (selected word line) to Vss and the remaining non-selected word lines to Vd*. The word-line selection signal wlsel_x becomes "H" during a hold state in which cell data is retained, and it becomes "L" for a non-selected state and "H" for a selected state after a standby state in which the cells can be accessed at any time.

For bit line decoding, respective bit lines are selectively connected to the local bus LB_m that is a common data bus among the standby units 100. This selection is performed by a bit-line selection signal blsel_y (y=i, i+1, ... ). This signal is set to "H" level that is higher than Vdd+Vt when the NMOS transistor QN2 is used to transmit sufficient levels to the bit lines. That is, during non-selected periods, all of the bit-line selection signals blsel_y (y=i, i+1, ... ) become "H" at Vdd level, a signal corresponding to the selected bit line that belongs to the selected standby unit 100 becomes "H" at a level higher than Vdd+Vt, and signals corresponding to non-selected bit lines become "L" at Vss level.

Next, a technique for detecting the defective cells to set the bit lines connected to the defective cells (i.e., defective bit lines) to floating state will be described below.

During standby periods, all of the bit-line selection signals blsel_y (y=i, i+1, ... ) are at "H", and the local bus LB_m is also separated from the sense amplifier 106 with the flag signal flag_m being set to "H". Accordingly, all of the bit lines are set to the level of the local bus. Specifically, the level of the local bus LB_m is Vs*, because both the NMOS transistors QN4 and M are on with the local-bus selection signal /lcbsel_m being at "H" and the signal /flag_m being also set to "H".

If any defective cells with large leakage exist in the standby unit 100, a current flows into the local bus LB_m via the bit line BL from Vd* level of the word line WL. While this current flows into Vs*, it raises the level of the drain node (bit-line-current monitoring node) IM_m as passing through the NMOS transistor M for sensing with a gate level of "H". A change in the level of the monitoring node IM_m is detected to determine whether any defective cells are present.

A flip-flop circuit 107 is a determination circuit for determining whether any defective cells are present as described above. The determination circuit 107 is configured with cross-coupled inputs and outputs of CMOS inverters 108 and 109. The input node of the CMOS inverter 109 is connected to the monitoring node IM_m via an NMOS transistor QN10, and the output node becomes the output node of a flag signal /flag_m. An NMOS transistor QN11 for resetting is connected to the input node of the CMOS inverter 109.

The determination circuit 107 is set to an initial state of /flag_m="H" because of HS="H" during a hold state. Upon entering a standby state, a signal "stdby" becomes "H" and HS becomes "L", and hence the state can be changed depending on the level of the monitoring node IM_m. If certain defects exist, then the state of the flip-flop is reversed and /flag_m becomes "L" due to a rise in the level of IM_m.

In this case, the determination circuit 107 has a flip-flop configuration such that large current will not be drawn from the monitoring node IM_m with the CMOS inverter 108 being sized smaller than that of the CMOS inverter 109. In addition, an acceptable value of the leakage is set by optimal setting of the threshold for the inputting inverter 109.

Once the signal /flag_m becomes "L", it still remains at "L" even if the local bus is selected with the flag_m of "H" and lcbsel_m becomes "H", and hence the sense amplifier system remains separated. Since the transistor M is also turned off at this moment, the local bus LB_m becomes a floating state and the bit line is in floating state even when it is selected.

If no defect exists, the signal /flag_m is at "H". Consequently, the flag_m becomes "L" and the local bus LB_m is connected to the sense amplifier system when the signal stdby becomes "L" and the local-bus selection signal lcbsel_m becomes "H". At this moment, the signal /lcbsel_m becomes "L", and hence the local bus is separated from Vs*.

This process then enters an access cycle, where only the selection signal blsel_y of the selected bit line becomes "H" level that is higher than Vdd+Vt, while the other non-selected bit lines are separated from the local bus LB_m and become a floating state.

[Memory Chip Configuration and Activation Scheme]

Figure 13:
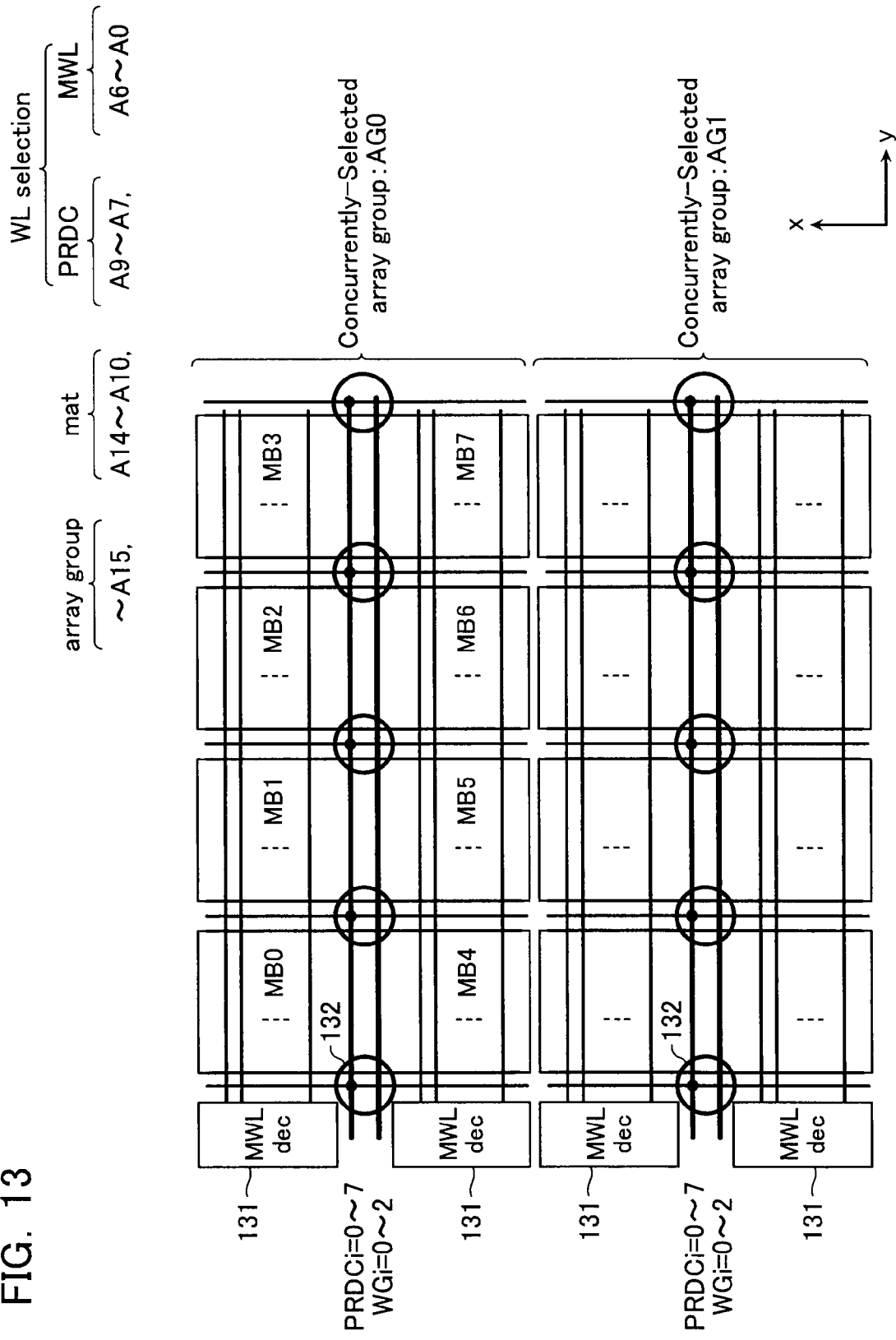
FIG. 13 illustrates a configuration of the memory chip and an activation selection scheme.

FIG. 13 illustrates an example memory chip configuration and activation selection scheme. In this case, it is assumed that such a double word line scheme is used where one cell array block includes 32 mats, each of which has 1k word lines, and a selection signal is sent to a plurality of partial word line drivers by selecting one main word line, thereby selecting a plurality of word lines.

In this case, it is intended that two array groups AG0 and AG1 be positioned in such a way that respective 8 cell array blocks MB0 to MB7 are included in one array group that are concurrently selected in the ×8I/O configuration.

Firstly, regarding allocation of address bits, A0 to A6 are applied to the selection of a main word line (MWL), while A7 to A9 are applied to the selection of a partial row decoder (PRDC). That is, consider A0 to A9 as the bits associated with selection of 1k word lines.

A10 to A14 are used for selection of 32 mats that are layers of cell arrays. A15 is a part associated with selection of the array groups AG0, AG1.

It is assumed that the memory chip is such memory with the ×8I/O configuration that includes 16 cell array blocks and handles 1 byte (=8 bits) of data at a time. In this memory, it is intended that only one cell can be accessed for each cell array. Thus, for ×8, 8 cell array blocks MB0 to MB7 should be accessed concurrently at any of the groups AG0 and AG1.

Main word line decoders (MWLdec) 131 are positioned at one ends of the main word lines MWL that extend across 4 cell array blocks. In addition, partial row decoders PRDC and transfer gate circuits 132 for transferring signals thereto are positioned between the cell array blocks MB0 and MB4 in the concurrently-selected array group, and similarly, between MB1 and MB5, between MB2 and MB6, and between MB3 and MB7, respectively.

The transfer gate circuits 132 are provided with signals PRDCi (=PRDC0 to PRDC7) for selectively driving the partial row decoders PRDC and selection signals WGi (=WG0 to WG2) for activating, according to a selected mat, a group word lines on the mat. These signals are decoded from address bits A7 to A9 and A10 to A14, respectively.

Figure 14:
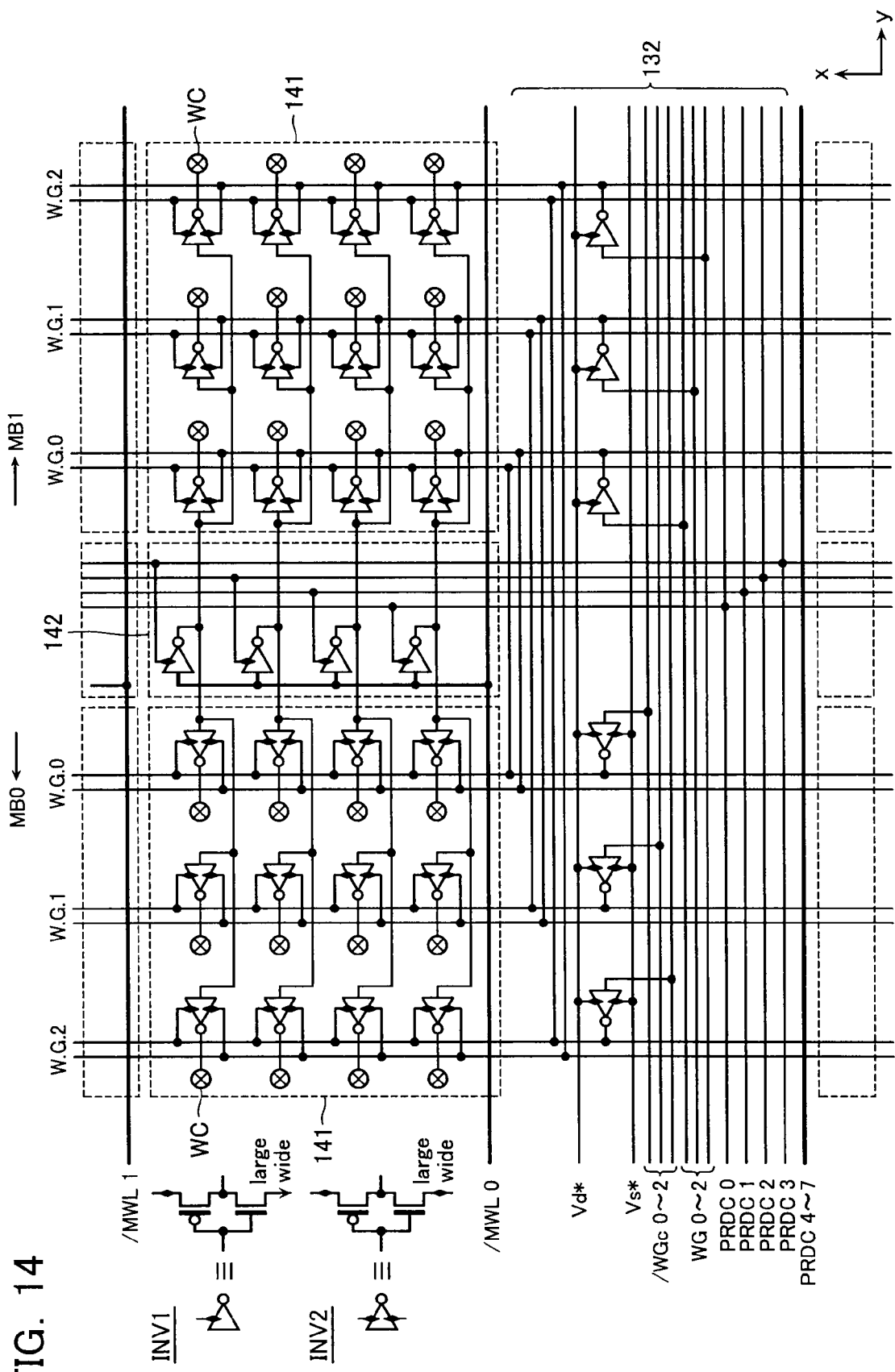
FIG. 14 illustrates a configuration of partial row decoder circuits and a transfer gate circuit part.

FIG. 14 illustrates a configuration including: a part for further decoding the signals WGi and PRDCi to select word lines, i.e., a part of one transfer gate circuit 132 illustrated in FIG. 13; word line drivers 141; and a partial row decoder 142. As provided between cell array blocks, it is important to configure the circuit as simple as possible such that it allows for the minimum necessary functions. The depicted circuit is configured on the assumption that the word lines are selected in ternary case.

The signals PRDCi, WGi, and /WGi extending in the y direction are commonly used among all cell arrays. FIG. 14 illustrates respective decoder circuits for further decoding these signals to provide word-line selection signals specific to the selected cell arrays. In FIG. 14, each WC represents a word line contact where a common vertical wiring is drawn to the substrate circuit part for each word line group in a 3D cell array block, and each word line driver 141 is configured by a group of drivers that provide output signals to WC.

Since this is the case of ternary, there exist three series of word line groups, W.G.0 to W.G.2, for each cell array block. As FIG. 14 illustrates a decoder circuit part that is common to two adjacent cell array blocks on the right and left sides, e.g., MB0 and MB1, the decoder circuit part has word line contacts WC in respective three word line groups corresponding to each of the cell array blocks.

There are two types of circuits that act as signal inverters, which are symbolized herein. That is, inverters INV1, in which the sources of respective NMOS transistors are connected to Vss and signals are input to the sources of respective PMOS transistors, are represented with down arrows attached to the upper sides of their inverter symbols. Inverters INV2, in which signals are input to the sources of both the NMOS and PMOS transistors, are represented with inward arrows attached to the upper and lower sides of their inverter symbols. In either case, the NMOS transistors have a large gate width w to reduce the on-impedance.

In the transfer gate circuit 132, signals WGi, /WGi are sent to the word line drivers 141 as word-line-group selection signals, respectively. In addition, signals PRDC0 to PRDC3 are sent to the partial row decoder 142 between the cell array blocks MB0, MB1.

The word line drivers 141 surrounded by a broken line are repeated as many times as the number of main word line signals /MWL. Note that since the word lines WL in a cell array block are alternately wired from the right and left sides of each cell array, as described in relation to FIG. 1, the cell array blocks on the right and left sides of the partial decoder circuit 142 of FIG. 14 are generally mirror reversed in view of the layout. Signals PRDC4 to PRDC7, instead of PRDC0 to PRDC3, are connected to another partial row decoder circuit (which is located between the cell array blocks MB2, MB3) next to the one illustrated in FIG. 14, and 8 word lines WL are selectively driven for each main word line signal /MWL in one cell array block.

A brief description of the respective signals (lines) is given as follows:

/MWLx: a main word line (signal) common to all (eight) of the selected cell array blocks that is generated at a main word line decoder (MWLdec) 131 to select a partial row decoder 142 positioned between cell array blocks.

Vd*: a power supply line at a level lower than the power supply voltage Vdd by on the order of a diode forward voltage drop Vf.

Vs*: a power supply line at a level higher than the ground potential Vss by on the order of a diode's forward bias voltage Vf.

/WGc0 to /WGc2: inverted signals of WGc0 to WGc2 for selecting one word line group on the selected cell together with another word line group to be selected with the one word line group.

WG0 to WG2: selection signals for selecting a word line group on a selected cell.

PRDC0 to PRDC3: drive signals, each selectively supplied to a partial-word-line driver circuit on one word line end of each cell array block.

PRDC4 to PRDC7: drive signals, each selectively supplied to a partial-word-line driver circuit on the other word line end of each cell array block.

FIG. 15 generally illustrates the setting values of the levels of the word lines according to the decoder circuits of FIG. 14.

For notations, impedance states of the word line connection to power supply signals are represented by H, H', and L.

The symbol H indicates that there is involved a part where Vd* is supplied to a word line via the corresponding NMOS transistor, or Vs* is supplied thereto via the corresponding PMOS transistor, and that a path to the power supply has a high impedance. The symbol H' indicates that Vd* is supplied via the corresponding PMOS transistor, but a transistor has a gate level with a loss of the threshold voltage Vth, and hence the transistor exhibits a slightly smaller conductance and correspondingly has a higher impedance. The symbol L indicates that a power supply signal is supplied with its intrinsic impedance without any loss at the corresponding transistor.

According to the table, consider how the impedance states and levels of the word lines vary with the selection signal states in the decoders. Firstly, the meaning of each section of the table will be described below. The section "WG/WGc" indicates that the signal WGc is classified into a section "selected" and a section "non-selected". The section "selected" is further broken into two sections: one is where a word line group is selected as cell access (WG="H"), and the other is where a word line group is selected as a pair with the selected word line group (WG="L").

In either case, the main word line selection signal MWL is classified into a section "selected" or a section "non-selected". Since the MWL selects a partial word line driver if it is "selected", the PRDC is classified into "selected" and "non-selected", setting separate word line levels accordingly.

A brief description of the states of individual word lines follows. The description will be made on "word line impedance-level" section from top to bottom:

1: the selected word line. It is connected to Vss when the impedance is L.
2: a word line that belongs to the same partial word line driver as the selected word line, but not selected by a PRDC signal. It is connected to Vd* when the impedance is H', because the gate level of the corresponding PMOS transistor is created via the Vth loss at the PMOS transistor.
3: a word line that belongs to the same word line group as 1 and 2, but belongs to a partial word line driver that is not selected by the main word line MWL. It is connected to Vd* when the impedance is L, because the gate of the corresponding PMOS transist or exactly becomes Vss.
4: a word line that is selected as a word line group paired with the selected word line group, that belongs to the partial word line driver selected by the same MWL signal as the selected cell, and that is selected by a PRDC signal. It has the impedance of H, because Vd* is connected to the word line from the NMOS transistor side.
5: a word line that is selected as a word line group paired with the selected word line group, that belongs to the partial word line driver selected by the same MWL signal as the selected cell, and that is not selected by a PRDC signal. It is connected to Vd* when the impedance is H', because the gate level of the PMOS transistor is created via the Vth loss at the corresponding PMOS transistor.
6: a word line that belongs to the same word line group as 4 and 5, but belongs to a partial word line driver that is not selected by the MWL. It is connected to Vd* when the impedance is L, because the gate of the corresponding PMOS transistor exactly becomes Vss.
7: a word line that belongs to a non-selected word line group, but selected by a PRDC signal from the partial word line driver selected by the MWL. It has the impedance of H, because Vd* is connected to the word line from the NMOS transistor side.
8: a word line that belongs to a non-selected word line group, and becomes "non-selected" by a PRDC signal from the partial word line driver selected by the MWL. It has the impedance of H', because the gate level of the PMOS transistor is created via the Vth loss at the corresponding PMOS transistor. It also has the impedance of H, because Vs* is connected to the word line from the PMOS transistor side.
9: a word line that belongs to the same word line group as 7 and 8, but belongs to a partial word line driver that is not selected by the MWL. It has the impedance of H, because Vs* is connected to the word line from the PMOS transistor side, although the gate of the corresponding PMOS transistor exactly becomes Vss.

For the word lines in selected WGc, although there is a difference in impedance, those connected to the non-selected cells become Vd* and those connected to the selected cells become Vss with impedance L. The word lines in non-selected WG, except those corresponding to the word lines connected to the selected cells, become Vs* with impedance H and those corresponding to the selected cells also become Vd* with impedance H. Accordingly, there is little impact on cross fails.

Note that while it is primarily desirable for 7 to be connected to Vs*, for the simplicity of circuitry, it is illustrated to be connected to Vd*.

Figure 16:
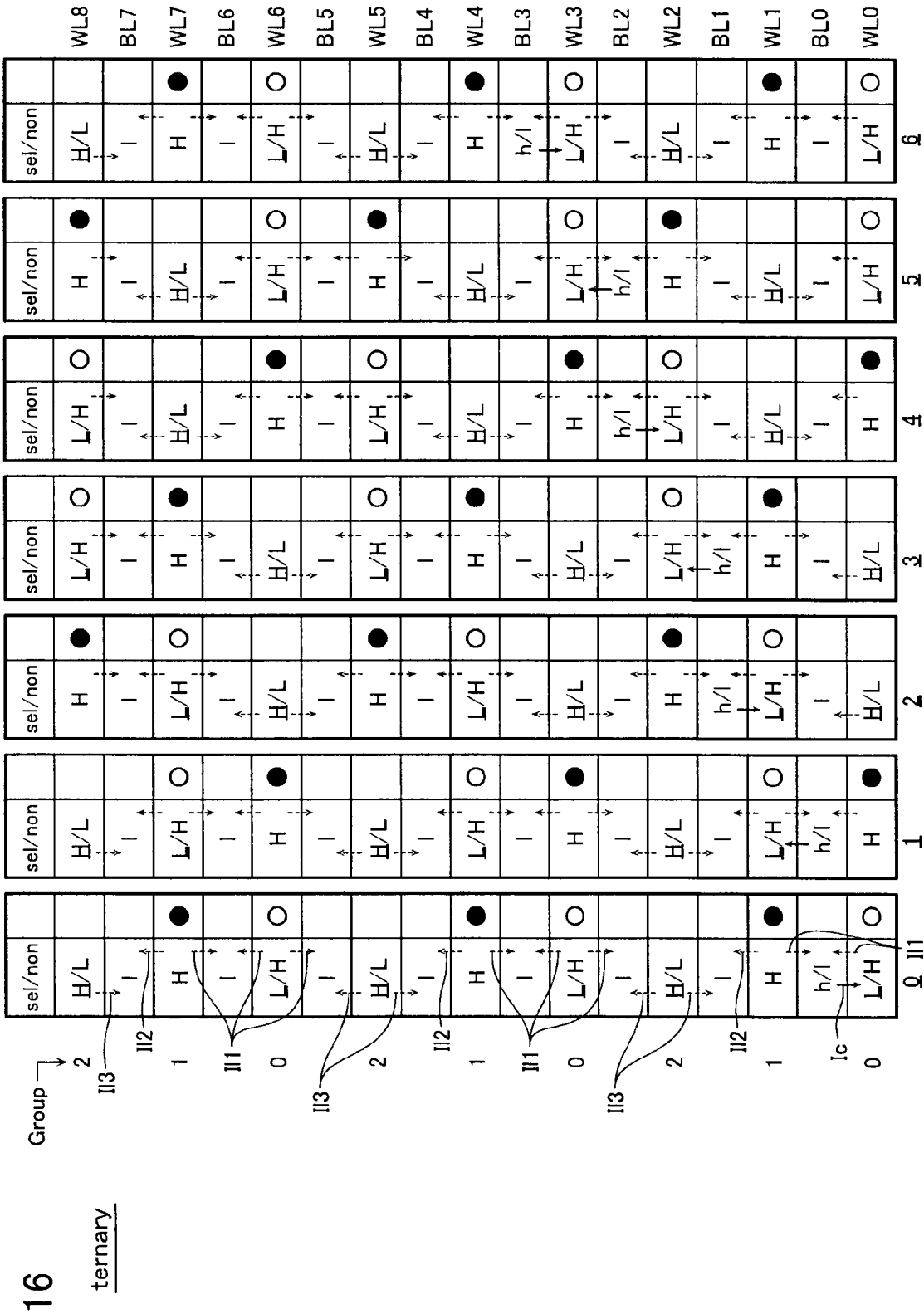
FIG. 16 illustrates the actual leakage current distribution in the case of ternary grouping in correspondence with FIG. 7.

Next, specifically consider how the leakage current flows at the time of the word line level setting, which is as illustrated in FIG. 16 in comparison to FIG. 7.

Since this is the case of ternary as in the case of FIG. 7, the word line groups are also divided into 3 groups as indicated by group numbers 0, 1, 2, for 16 mats. FIG. 16 illustrates, in correspondence to FIG. 7, the selected/non-selected states of the word lines and the bit lines on respective mats, as well as the state of the leakage current.

Upon selection of a cell in the mat 0, as illustrated in the leftmost table, the selected word lines become L and non-selected word lines become H in the group of word lines WL0, while the selected bit line becomes h and non-selected bit lines become 1 in the group of bit lines BL0. Then, a cell current Ic flows through the selected cell on the mat 0.

At the same time, as indicated by the white circles, selected/non-selected states are set in the groups of word lines WL3, WL6 in group 0, which is the same group as the selected word line group 0, as in the selected mat. The groups of word lines WL1, WL4, WL7 as indicated by the black circles are the other groups of word lines relating to the accessed mat and set to H, respectively. The unmarked groups of word lines are completely independent of mat selection and may remain at L level.

As in the case of FIG. 7, the leakage current Il1 flows due to the reverse breakdown voltage characteristics of the diodes or cross fails, and the leakage current Il2 having no impact on the selected word line group flows from the groups of word lines WL1, WL4, WL7 to the bit lines above these word lines.

The word lines are set to H/L in the groups of word lines WL2, WL5, WL8 that receive the same partial word line drive as that in the selected word line, and, in addition to the leakage current described in FIG. 7, the leakage current Il3 flows from these word lines to the adjacent bit lines at 1 level. Accordingly, while the amount of current flowing into the selected word line group increases, there is no substantial increase in the leakage current because one word line in the groups of non-selected word lines becomes the state of "7", as illustrated in FIG. 15, for each mat corresponding to a selected word line.

This is also the case when other mats are selected.

Figure 17:
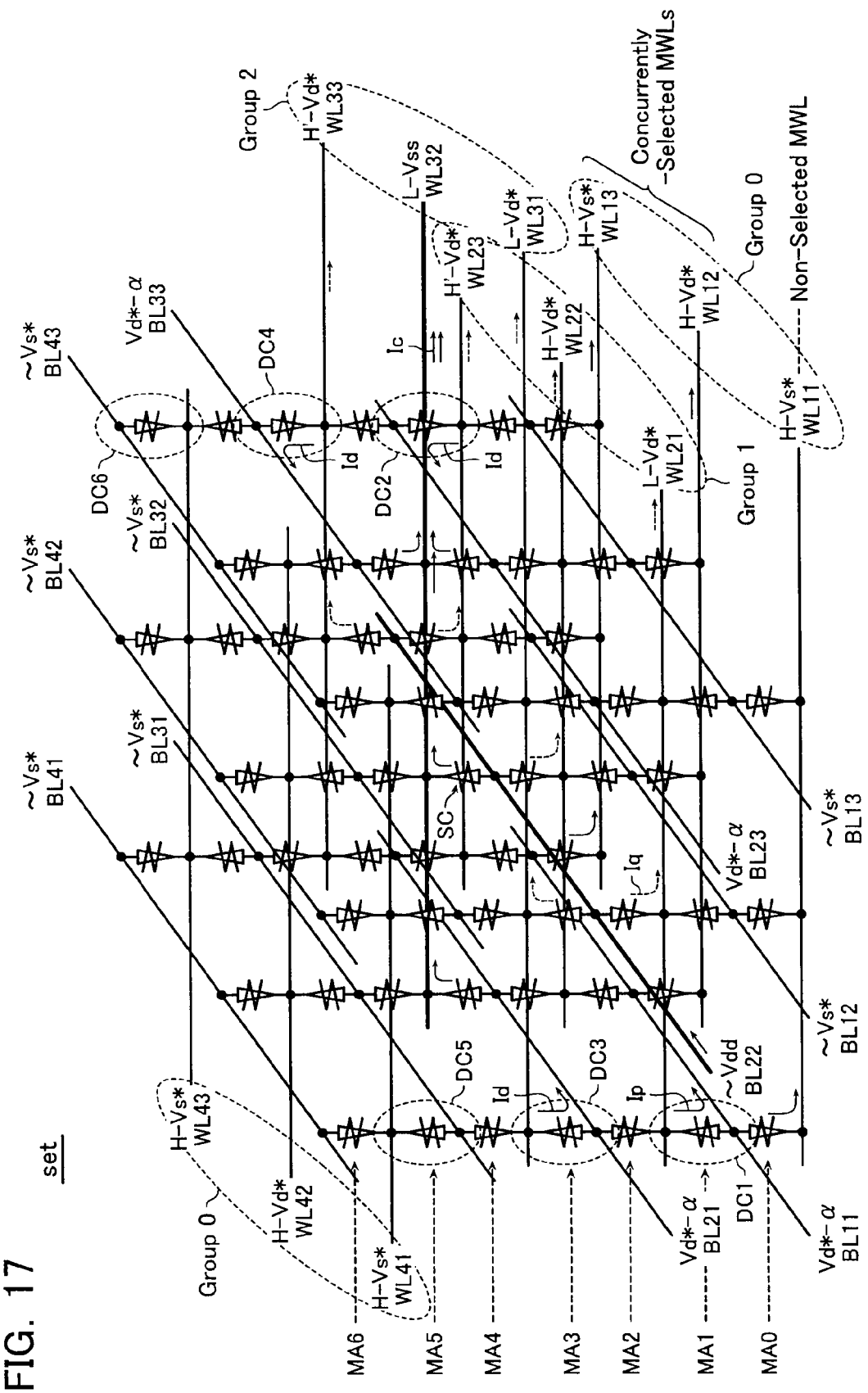
FIG. 17 illustrates the actual effects of leakage current in the case of ternary grouping in correspondence with FIG. 11.

FIG. 17 illustrates the above-mentioned state of the leakage current from the viewpoint of the actual 3D arrays, corresponding to FIG. 11 as mentioned above. The difference from FIG. 11 is that the non-selected word lines WL12, WL22, WL42 on other mats, each corresponding to the selected word line WL32 indicated by the thick line, all become H−Vd*. FIG. 17 illustrates three series of word line groups. As illustrated, among the respective three word lines for each mat, the two back most word lines are concurrently selected by a main word line signal MWL, while the one front word line is not selected by the main word line MWL.

In FIG. 17, since the defective cells are not assumed to belong to these word lines WL12, WL22, WL42, the leakage current flows in the same way as that described in FIG. 11.

As can be seen from the above, it is apparent that the leakage current due to cross fail or the like may be significantly reduced, in the case of sharing the word lines and the bit lines between layers, by dividing the word lines into three or more groups. The description is now made on a method for enabling mat selection to be associated with word line group selection, as illustrated in FIG. 10, in a particular circuit system.

Let WG be a selected-word-line-group number that is determined by the mat number to which the selected cell belong, and let WGc be a complementary selected-word-line-group number that is concurrently selected so as to be paired with the selected-word-line-group number. Let WGc=i−k (k=i, i−1, i−2, ... , 2, 1), where i is the number of word line groups. In addition, let m be the mat number to which the selected cell belongs. The word line group numbers selected for a given m are already defined in FIG. 10. The word line group numbers can be obtained by calculating k with 2WGc≡−2k≡m−1, m, m+1, m+2 (mod 2i).

Figures 18, 19:
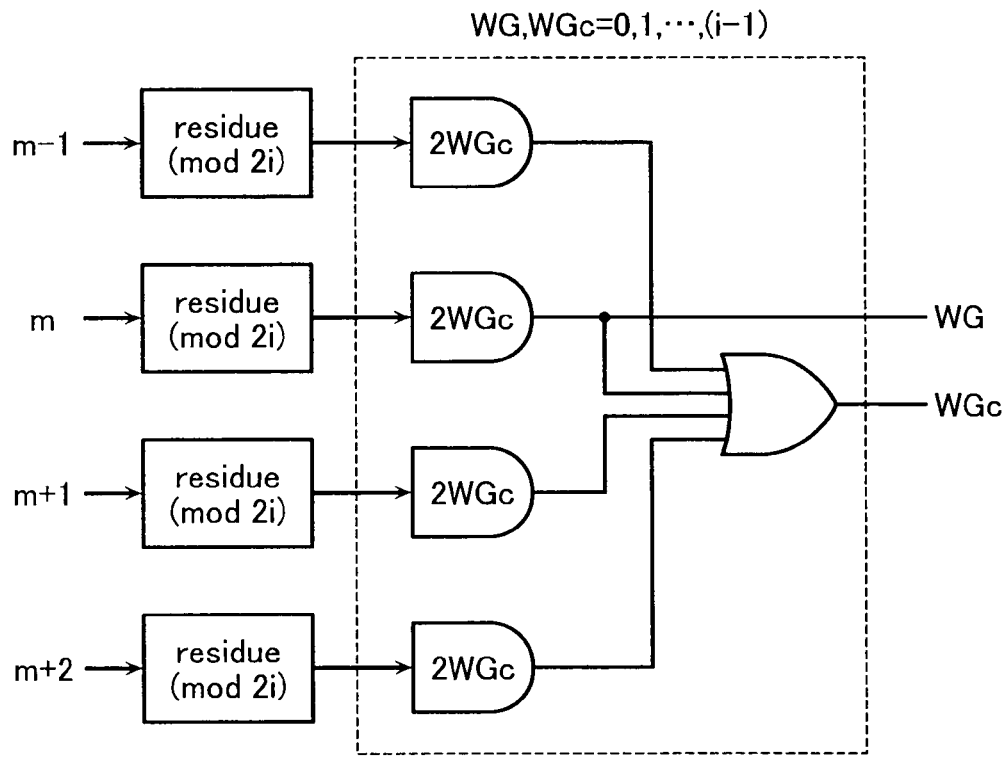
FIG. 18 illustrates a calculation scheme of word-line-group selection signals WG, WGc from the selected mat number.
FIG. 19 illustrates relations between address bits and mat numbers as well as between selection signals WGc and the mat numbers for ternary grouping.

FIG. 18 illustrates conceptual blocks for calculating such word line group numbers. This is also a word-line-group-selection circuit. Upon determination of the mat number m, m−1, m, m+1, m+2 are first calculated from m. These results are input to respective circuit blocks, residue (mod 2i), for obtaining reduced residues that represent congruent numbers modulo 2i, by which the residues are obtained. The residues are then searched for any residue that matches the binary representation of 2WGc, by the decoder circuits corresponding to the word line group numbers WGc, calculating AND of respective bits of the residue represented in binary notation. If any of the residues matches, then the corresponding WGc is selected as a selection signal. In addition, the result of the match search of the residue of m is taken as a selection signal WG, which becomes the selected-word-line-group number. It is necessary to provide the match search circuits as many as i, wherein WGc=0 to i−1.

[Word-Line-Selection-Signal Generation Circuit—Ternary]

Consider a particular word-line-selection-signal generation circuit in ternary case (i=3).

As illustrated in FIG. 19, it is assumed that the total number of mats is 32, and the mat numbers are represented in binary notation by 5 bits of A10 to A14. The relation between respective address bits and the mat number m is as illustrated in the upper table in FIG. 19, and the relation between WGc (0, 1, 2), and m, and mod 6 is as illustrated in the lower table.

Figure 20:
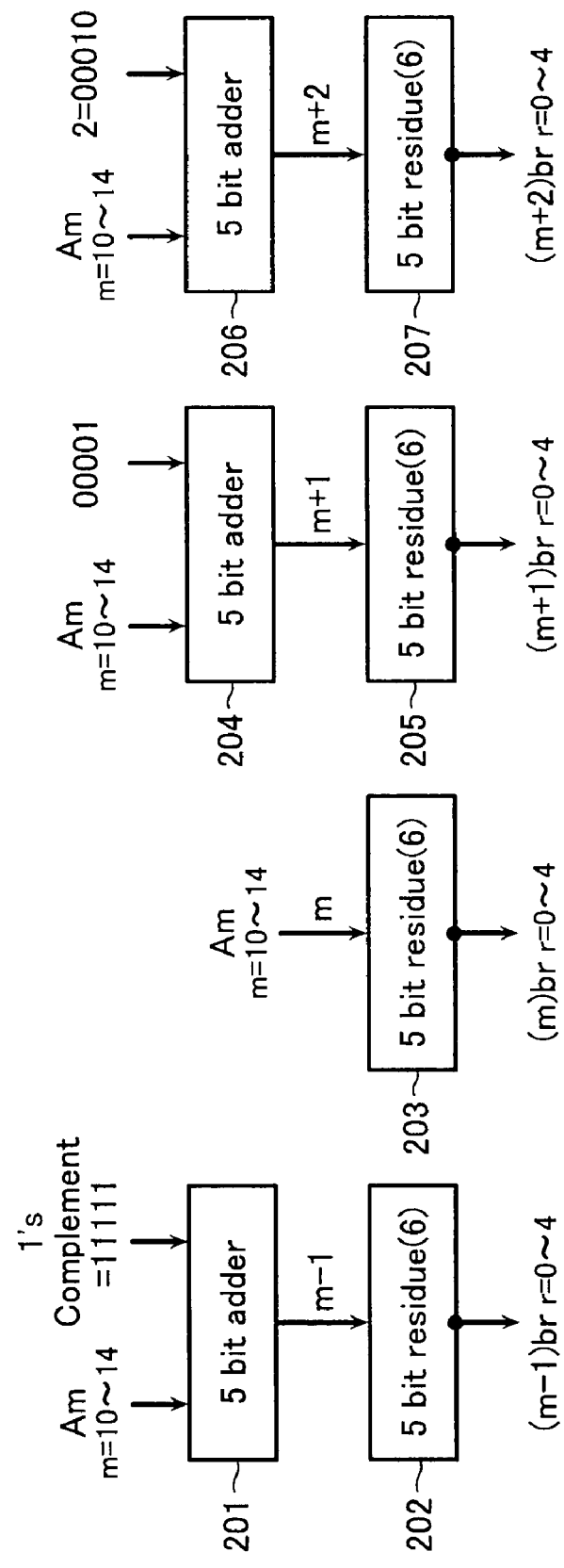
FIG. 20 illustrates a circuit for obtaining a reduced residue of a mat number from an address bit for ternary grouping.

FIG. 20 illustrates a mat number calculation circuit 200 that obtains the reduced residues (m−1)br, (m)br, (m+1)br, (m+2)br of m−1, m, m+1, m+2 mod 6 from the address bits representing a mat number m. The description will be made first from the left most circuit block:

(m−1)br: the address bits of m and the 5-bit one's complement, 11111, are input to a 5-bit adder 201 to obtain the addition result, m−1. The result is then input to a residue circuit (5 bit residue (6)) 202 for obtaining a residue mod 6, thereby obtaining the binary representation of the residue, (m−1)br (r=0 to 4).

(m)br: the address bits of m by 5 bits are input to a residue circuit (5 bit residue (6)) 203 for obtaining a residue mod 6 to obtain the binary representation of the residue, (m)br (r=0 to 4).

(m+1)br: the address bits of m and the 5-bit representation of 1, i.e., 00001, are input to a 5-bit adder 204 to obtain the addition result, m+1. The result is then input to a residue circuit (5 bit residue (6)) 205 for obtaining a residue mod 6, thereby obtaining the binary representation of the residue, (m+1)br (r=0 to 4).

(m+2)br: the address bits of m and the 5-bit representation of 2, i.e., 00010, are input to a 5-bit adder 206 to obtain the addition result, m+2. The result is then input to a residue circuit (5 bit residue(6)) 207 for obtaining a residue mod 6, thereby obtaining the binary representation of the residue, (m+2)br (r=0 to 4).

Figure 21:
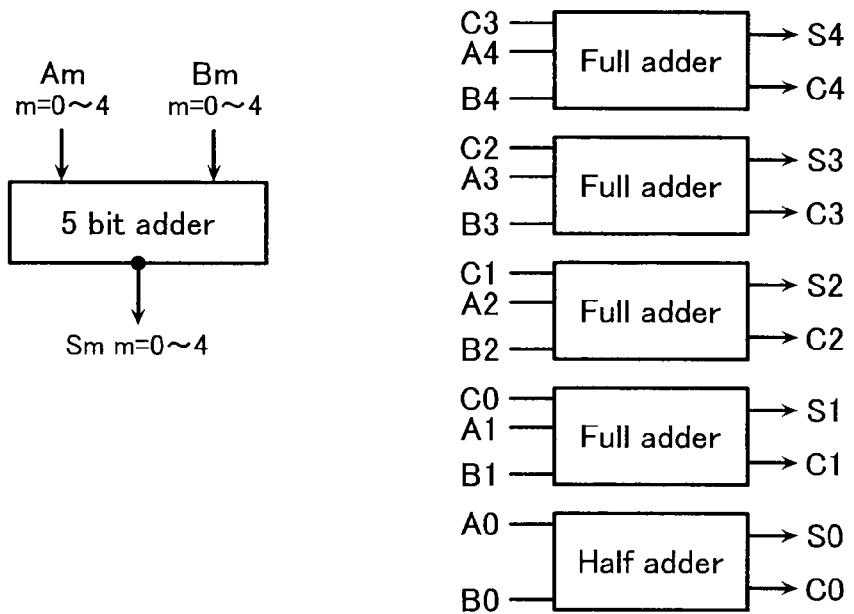
FIG. 21 illustrates the configuration of the 5-bit adders used in FIG. 20.

FIG. 21 illustrates an example configuration of the above-mentioned 5 bit adders 201, 204, 206. In this case, one example adder is illustrated where the sum of binary digits of numbers A and B is given by full adders and a half adder. The adder is configured to reduce the timing control load on the system in such a way that an output is determined upon determination of the input without the need for synchronizing clocks or the like.

Figure 22:
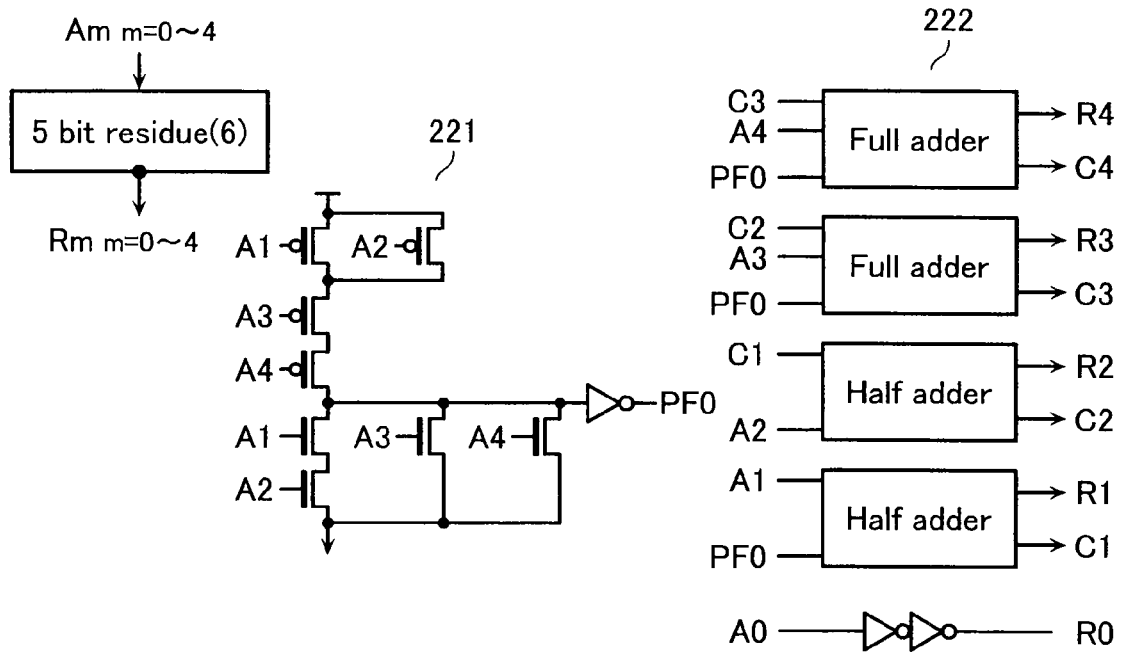
FIG. 22 illustrates the configuration of the 5-bit residue circuits used in FIG. 20.

FIG. 22 illustrates an example configuration of the residue circuits 202, 203, 205, 207 for obtaining a 5-bit residue mod 6. This includes a detection unit 221 for detecting that a number A represented in binary becomes equal to or greater than 6, and an adder unit 222 for adding the 6's complement for the 5 bits, i.e., 26 (=32−6) (i.e., 11010 in binary notation) based on the detection result.

This circuit is also configured to reduce the timing control load on the system in such a way that an output is determined upon determination of the input without the need for synchronizing clocks or the like.

Figure 23:
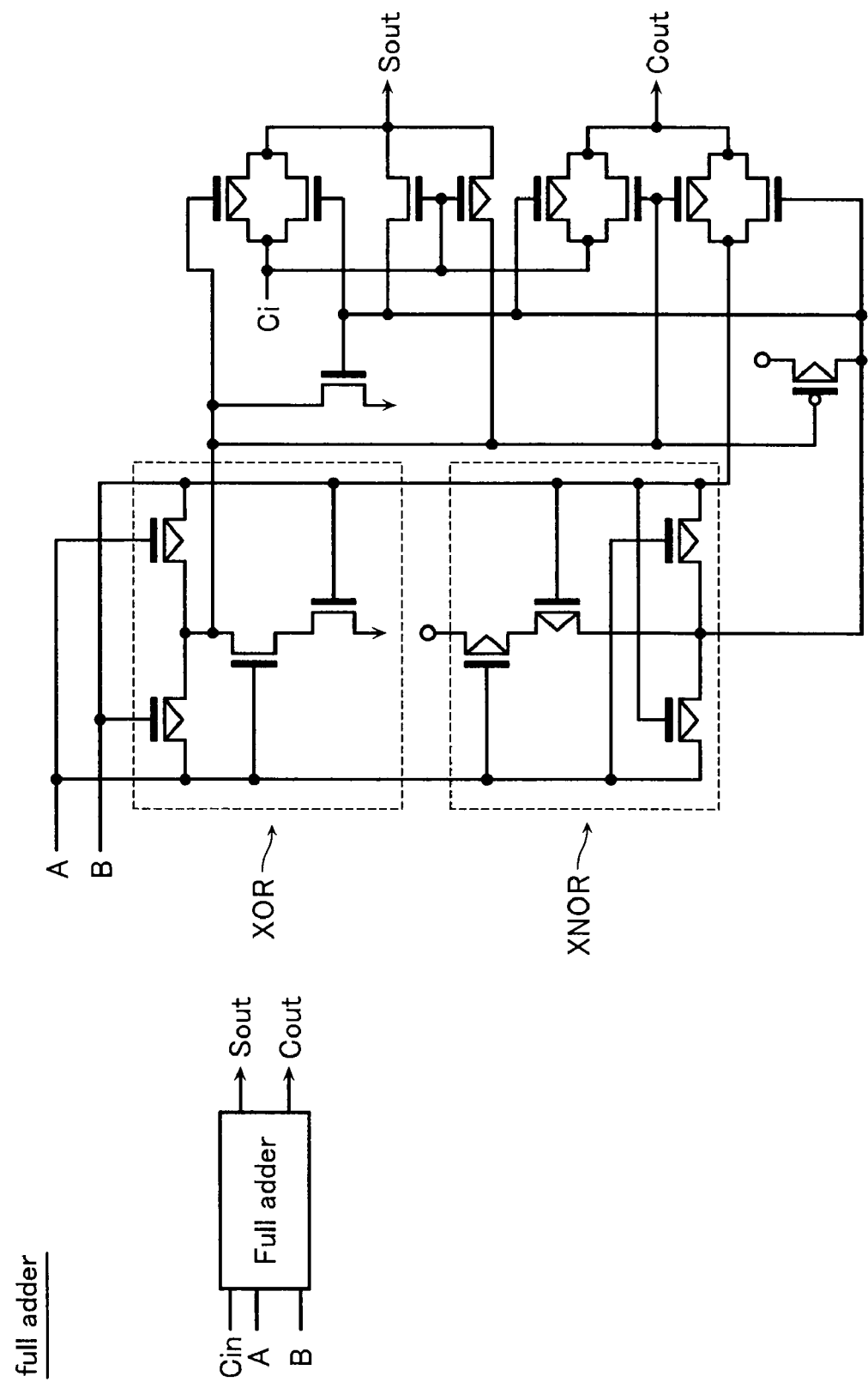
FIG. 23 illustrates a configuration of a full adder.
Figure 24:
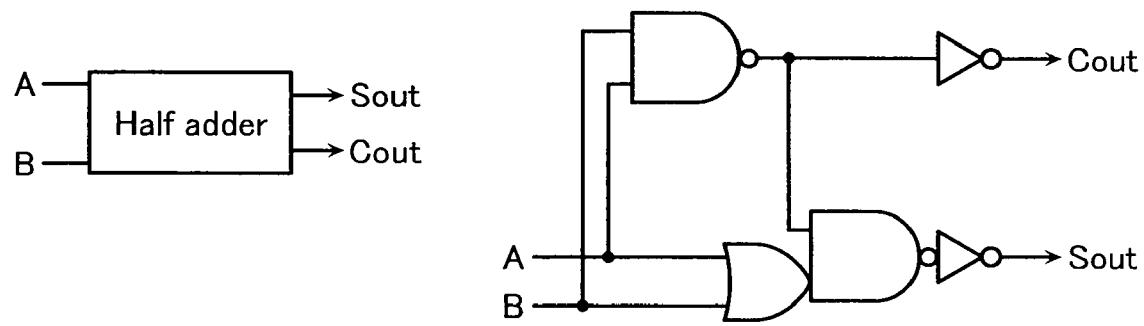
FIG. 24 illustrates a configuration of a half adder.

FIGS. 23 and 24 each illustrate a full adder and a half adder, each of which is a basic unit for performing the addition of binary numbers. The full adder performs logical operations on bits A and B to be added at XOR and XNOR circuits, and further on a carry signal Cin to output the sum Sout of A and B and Cin, as well as a carry signal Cout as output. The half adder may include general logic gates.

Figure 25:
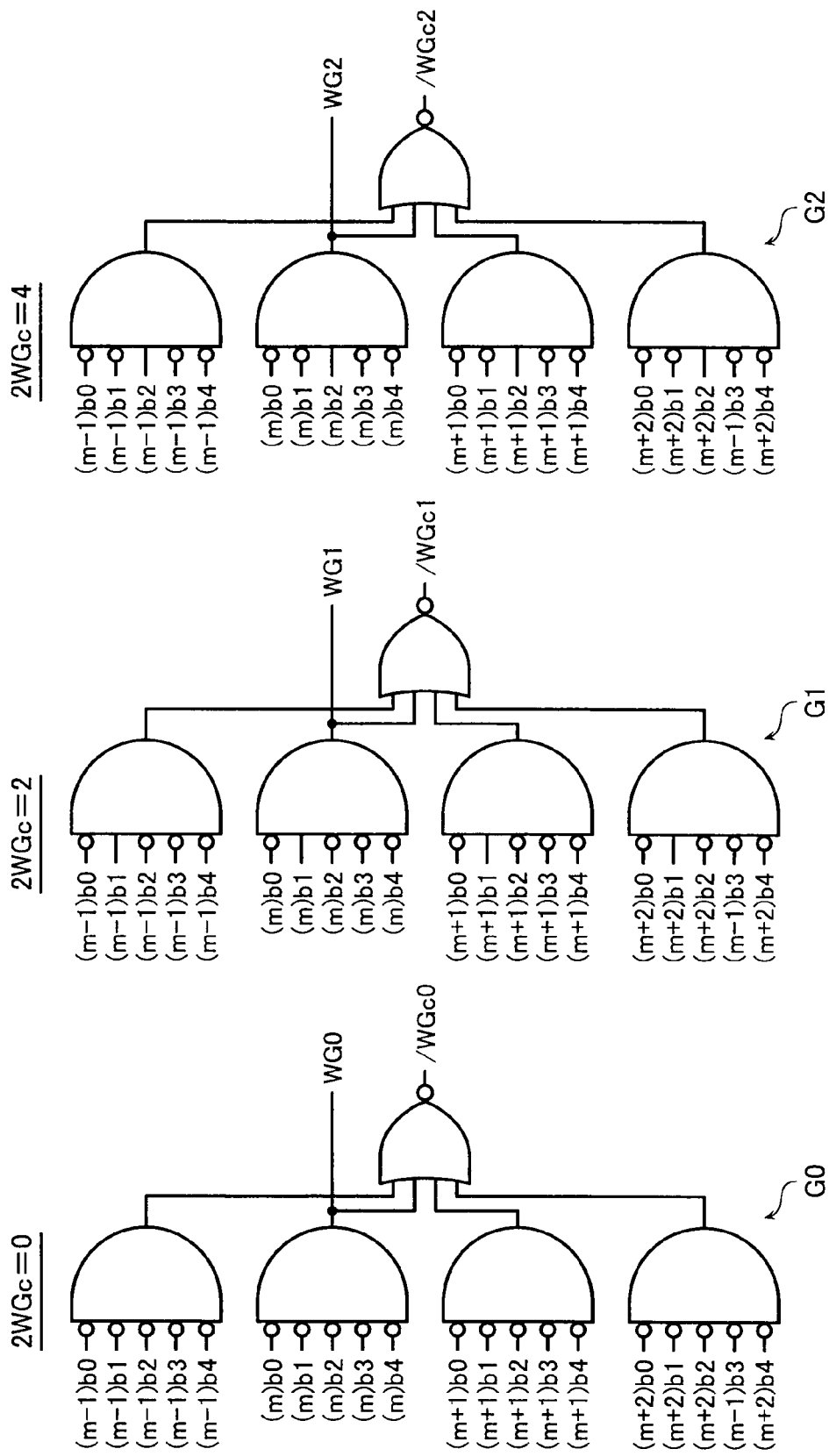
FIG. 25 illustrates a word-line-group-selection-signal generation circuit for ternary grouping.

FIG. 25 illustrates a group-selection-signal decoding circuit 210 for generating selection signals WG and /WGc to eventually select a word line group from the selected mat number m, in ternary case (i=3). This is a circuit for searching (m−1)br (r=0 to 4), (m)br (r=0 to 4), (m+1)br (r=0 to 4), and (m+2)br (r=0 to 4) calculated from m as the residues mod 6, for any of the residues that matches 2WGc=0, 2, or 4, respectively.

That is, the match search is performed at a group of AND circuits G0 to G2 for detecting the matched/unmatched status of respective residue bits, and it is based on the logic wherein the signal /WGc falls if any of the four residues matches, and the signal WG rises if (m)br (r=0 to 4) matches. The search of 2WGc=0 results in the signals WG0 and /WGc0, the search of 2WGc=2 results in the signals WG1 and /WGc1, and the search of 2WGc=4 results in the signals WG2 and /WGc2.

[Word-Line-Group-Selection-Signal Generation Circuit—Quadruple]

Next, consider a specific word-line-group-selection-signal generation circuit in quadruple case (i=4). It is assumed that the total number of mats is 32, and the mat numbers are represented in binary notation by 5 bits of A10 to A14. The relation between respective address bits and m is as illustrated in the upper table in FIG. 26. The relation between selection signals WGc (0, 1, 2, 3), and m, and mod 8 is as illustrated in the lower table.

Figure 27:
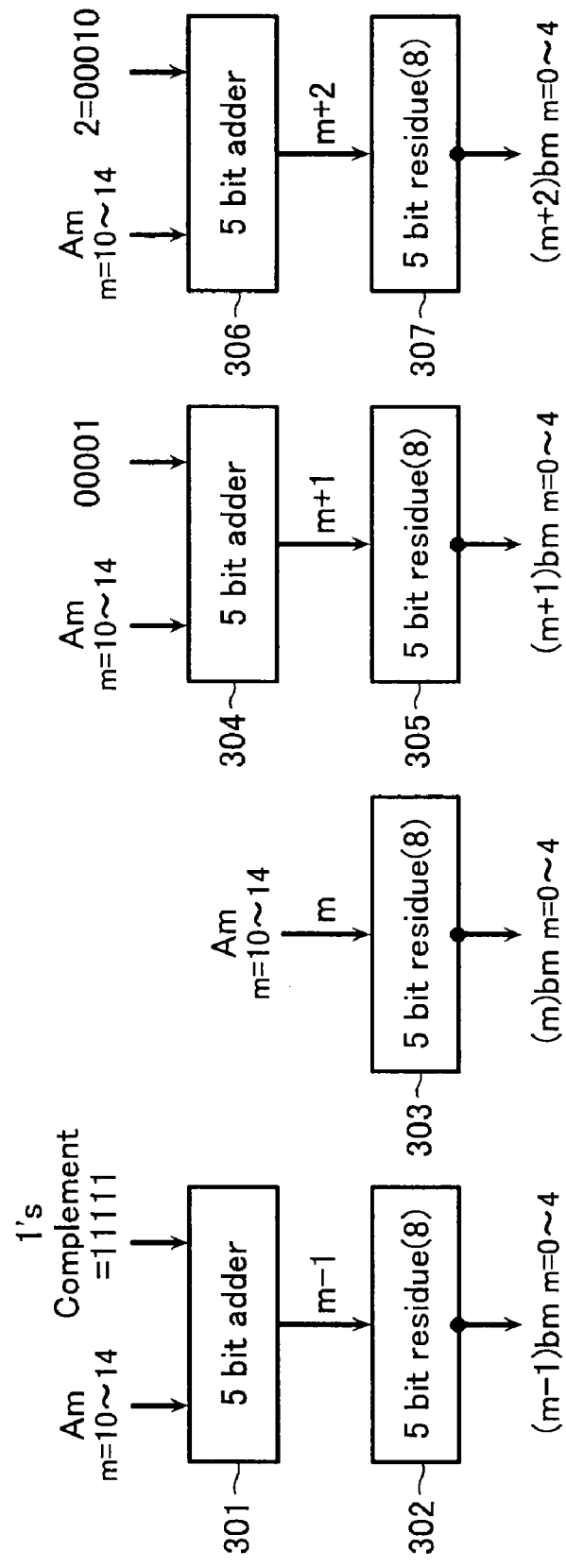
FIG. 27 illustrates a circuit for obtaining a reduced residue of a mat number from an address bit for quadruple grouping.

FIG. 27 illustrates a mat number calculation circuit 300 that obtains the reduced residues (m−1)bm, (m)bm, (m+1)bm, (m+2)bm of m−1, m, m+1, m+2 mod 8 from the address bits representing a mat number m. The description will be made first from the left most circuit block:

(m−1)bm: the address bits of m and the 5-bit one's complement, 11111, are input to a 5-bit adder 301 to obtain the addition result, m−1. The result is then input to a residue circuit (5 bit residue (8)) 302 for obtaining a residue mod 8, thereby obtaining the binary representation of the residue, (m−1)bm (m=0 to 4).

(m)bm: the address bits of m by 5 bits are input to a residue circuit (5 bit residue(8)) 303 for obtaining a residue mod 8 to obtain the binary representation of the residue, (m)bm (m=0 to 4).

(m+1)bm: the address bits of m and the 5-bit representation of 1, 00001, are input to a 5-bit adder 304 to obtain the addition result, m+1. The result is then input to a residue circuit (5 bit residue(8)) 305 for obtaining a residue mod 8, thereby obtaining the binary representation of the residue, (m+1)bm (m=0 to 4).

(m+2)bm: the address bits of m and the 5-bit representation of 2, 00010, are input to a 5-bit adder 306 to obtain the addition result, m+2. The result is then input to a residue circuit (5 bit residue (8)) 307 for obtaining a residue mod 8, thereby obtaining the binary representation of the residue, (m+2)bm (m=0 to 4).

Figure 28:
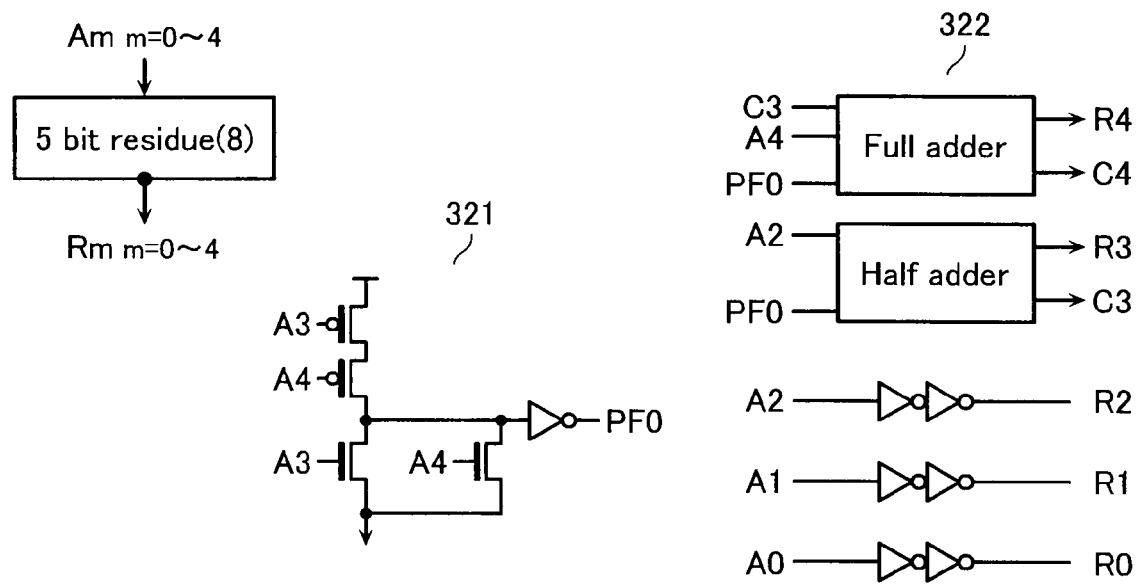
FIG. 28 illustrates the configuration of the 5-bit residue circuits used in FIG. 27.

FIG. 28 illustrates an example configuration of the residue circuits (5 bit residue(8)) 302, 303, 305, 307 for obtaining a 5-bit residue mod 8. This includes a detection unit 321 for detecting that a number A represented in binary becomes equal to or greater than 8, and an adder unit 322 for adding the 8's complement for the 5 bits, i.e., 24 (=32−8=24) (i.e., 11000 in binary notation) based on the detection result.

Figure 29:
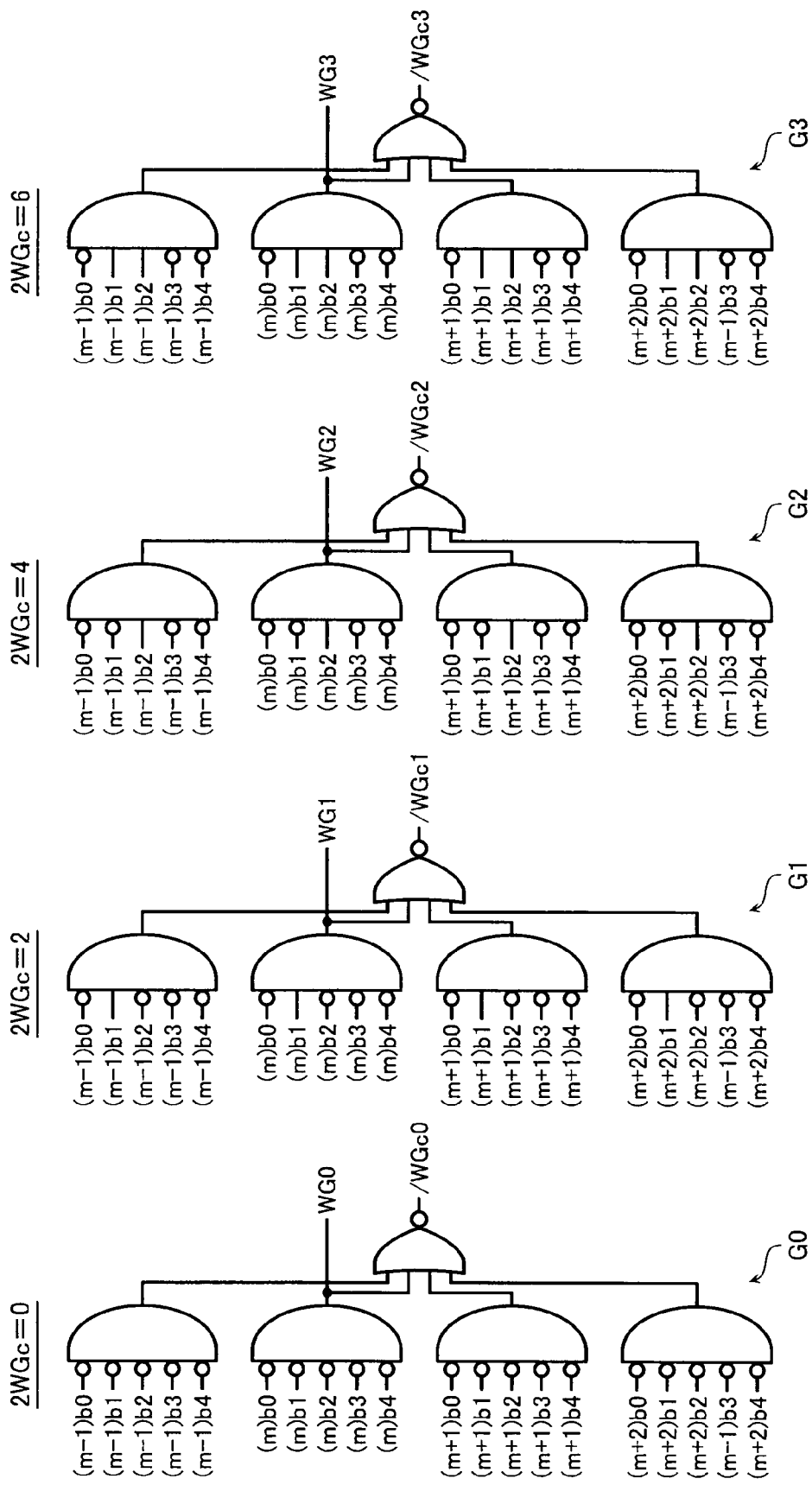
FIG. 29 illustrates a word-line-group-selection-signal generation circuit for quadruple grouping.

FIG. 29 illustrates a group-selection-signal decoding circuit 310 for generating selection signals WG and /WGc to eventually select a word line group from the selected mat number m, in quadruple case (i=4). This is a circuit for searching (m−1)bm (m=0 to 4), (m)bm (m=0 to 4), (m+1)bm (m=0 to 4), (m+2)bm (m=0 to 4) calculated from m as the residues mod 8, for any of the residues that matches 2WGc=0, 2, 4, or 6, respectively.

That is, the match search is performed at a group of AND circuits G0 to G3 for detecting the matched/unmatched status of respective residue bits, and it is based on the logic wherein the signal /WGc falls if any of the four residues matches, and the signal WG rises if (m)bm (m=0 to 4) matches. The search of 2WGc=0 results in the signals WG0 and /WGc0, the search of 2WGc=2 results in the signals WG1 and /WGc1, the search of 2WGc=4 results in the signals WG2 and /WGc2, and the search of 2WGc=6 results in the signals WG3 and /WGc3.

As described above, this embodiment performs selective activation of the laminated memory mats separated three or more layers of groups, in the 3D memory device including cross point cells. Therefore, this embodiment may reduce the layout area for connecting vertical wirings to the decoder circuits on the substrate below the cell arrays, while mitigating the effects of leakage current due to cross fail.

What is claimed is:

1. A three-dimensional memory device comprising:
a plurality of mats laminated therein, each having memory cells arranged in a two-dimensional manner; and access signal lines and data lines to select memory cells in each mat being shared between respective adjacent mats,
laminated mats being divided into three or more groups, and, when selecting one of these groups, memory cells in some of the remaining groups being biased so that a leakage current flows therethrough, while memory cells in the rest of the remaining groups being biased so that a leakage current is reduced,
wherein each of the mats includes memory cells positioned at cross-points of the access signal lines and the data lines, each of the memory cells having a variable resistance element and a diode connected in series, the variable resistance element being capable of setting a resistance value in a reversible manner by applying voltage, and diodes between the access signal lines and the data lines are set to reverse-biased state in the some of the remaining groups, while diodes between access signal lines and data lines are set to substantially-zero-biased state in the rest of the remaining groups.

2. The three-dimensional memory device according to claim 1, wherein
the mats that belong to one of the plurality of groups share the access signal lines.

3. The three-dimensional memory device according to claim 1, further comprising:
a double word line scheme comprising:
a main word line decoder circuit configured to select a main word line to supply a selection signal; and
a plurality of partial row decoder circuits selected by the main word line to set potentials of the access signal lines,
wherein each of the partial row decoder circuits is provided for the access signal lines provided for each of the plurality of groups.

4. The three-dimensional memory device according to claim 3, wherein
the main word line decoder circuit and the partial row decoder circuits control paths along which current flows to the access signal lines, according to a signal to select the plurality of groups.

5. The three-dimensional memory device according to claim 3, wherein
the access signal lines are connected to output terminals of the partial row decoder circuit on a substrate for each of the plurality of groups.

6. The three-dimensional memory device according to claim 1, wherein
one of the data lines that is connected to a defective cell with reverse leakage current greater than a certain value is set in a floating state.

7. A three-dimensional memory device comprising:
a semiconductor substrate;
a three-dimensional cell array having a plurality of mats laminated on the semiconductor substrate, each having memory cells arranged in a two-dimensional manner, and access signal lines and data lines to select memory cells in each mat being shared between respective adjacent mats; and
a control circuit formed on the semiconductor substrate below the three-dimensional cell array, the control circuit controlling read and write of the three-dimensional cell array,
the control circuit having a group selection circuit, the group selection circuit, when mats in the three-dimensional cell array being divided into three or more groups, and when one of these groups being selected, being configured to select some of the remaining groups concurrently, and not to select the rest of the remaining groups.

8. The three-dimensional memory device according to claim 7, wherein
the group selection circuit comprises:
a calculation circuit configured to calculate, based on an input address bit, a plurality of mat numbers that belong to a selected group including a selected memory cell as reduced residues modulo 2i (where i is the number of groups); and
a group-selection-signal decoding circuit configured to decode, based on a result of the calculation circuit, a first selection signal to select one of the plurality of groups and a second selection signal to select the some of the remaining groups concurrently.

9. The three-dimensional memory device according to claim 8, wherein
the control circuit further comprises:
a main word line decoder circuit configured to select a main word line to supply a main word line signal; and
a plurality of partial row decoder circuits each provided on the access signal lines for each of the plurality of groups, the plurality of partial row decoder circuits being selected by the main word line signal and a partial-row-decoder drive signal to set potentials of the access signal lines.

10. The three-dimensional memory device according to claim 9, wherein
the control circuit controls paths along which current flows to the access signal lines, according to the first selection signal, the second selection signal, the main word line signal, and the partial-row-decoder drive signal.

11. The three-dimensional memory device according to claim 9, wherein
the access signal lines are connected to output terminals of the partial row decoder circuit on a substrate for each of the plurality of groups.

12. The three-dimensional memory device according to claim 7, wherein
each mat in the three-dimensional cell array includes memory cells positioned at cross-points of the access signal lines and the data lines, each of the memory cells having a variable resistance element and a diode connected in series, the variable resistance element being capable of setting a resistance value in a reversible manner by applying voltage, and
when selecting one of the plurality of groups in the three-dimensional cell array, diodes between access signal lines and data lines are set to reverse-biased state in the some of the remaining groups, while memory cells are set to inactive state without any leakage in the rest of the remaining groups.

13. The three-dimensional memory device according to claim 7, wherein
the mats that belong to one of the plurality of groups share the access signal lines.

14. The three-dimensional memory device according to claim 7, wherein
one of the data lines that is connected to a defective cell with reverse leakage current greater than a certain value is set in a floating state.

15. A three-dimensional memory device comprising:
a semiconductor substrate;
a mat including memory cells arranged in a two-dimensional manner on the semiconductor substrate, the memory cells positioned at cross-points of access signal lines and data lines, each of the memory cells having a variable resistance element and a diode connected in series, the variable resistance element being capable of setting a resistance value in a reversible manner by applying voltage;
a three-dimensional cell array including a plurality of the mats laminated therein, with the access signal lines or the data lines being shared between adjacent mats; and
a control circuit formed on the semiconductor substrate below the three-dimensional cell array, the control circuit controlling read and write of the three-dimensional cell array,
the control circuit having a group selection circuit, the group selection circuit, when mats in the three-dimensional cell array being divided into three or more groups, and when one of these groups being selected, being configured to select some of the remaining groups concurrently, and not to select the rest of the remaining groups, and
when selecting one of the plurality of groups in the three-dimensional cell array, the group selection circuit being configured to set diodes between access signal lines and data lines to reverse-biased state in some of the remaining groups, and memory cells to inactive state without any leakage in the rest of the remaining groups.

16. The three-dimensional memory device according to claim 15, wherein
the group selection circuit comprises:
a calculation circuit configured to calculate, based on an input address bit, a plurality of mat numbers that belong to a selected group including a selected memory cell as reduced residues modulo 2i (where i is the number of groups); and
a group-selection-signal decoding circuit configured to decode, based on a result of the calculation circuit, a first selection signal to select one of the plurality of groups and a second selection signal to select the some of the remaining groups concurrently.

17. The three-dimensional memory device according to claim 16, wherein
the control circuit further comprises:
a main word line decoder circuit configured to select a main word line to supply a main word line signal; and
a plurality of partial row decoder circuits each provided on the access signal lines for each of the plurality of groups, the plurality of partial row decoder circuits being selected by the main word line signal and a partial-row-decoder drive signal to set potentials of the access signal lines.

18. The three-dimensional memory device according to claim 17, wherein the group selection circuit, the main word line decoder circuit, and the partial row decoder circuits control paths along which current flows to the access signal lines, according to the first selection signal, the second selection signal, the main word line signal, and the partial-row-decoder drive signal.

19. The three-dimensional memory device according to claim 17, wherein the access signal lines are connected to output terminals of the partial row decoder circuit on a substrate for each of the plurality of groups.

* * * * *